United States Patent
Shibuya et al.

(10) Patent No.: US 10,530,084 B2
(45) Date of Patent: *Jan. 7, 2020

(54) METALLIC MATERIAL FOR ELECTRONIC COMPONENTS AND METHOD FOR PRODUCING SAME, AND CONNECTOR TERMINALS, CONNECTORS AND ELECTRONIC COMPONENTS USING SAME

(71) Applicant: JX Nippon Mining & Metals Corporation, Tokyo (JP)

(72) Inventors: Yoshitaka Shibuya, Hitachi (JP); Kazuhiko Fukamachi, Hitachi (JP); Atsushi Kodama, Hitachi (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 723 days.

This patent is subject to a terminal disclaimer.

(21) Appl. No.: 14/411,789

(22) PCT Filed: Jun. 27, 2013

(86) PCT No.: PCT/JP2013/067728
§ 371 (c)(1),
(2) Date: Dec. 29, 2014

(87) PCT Pub. No.: WO2014/003145
PCT Pub. Date: Jan. 3, 2014

(65) Prior Publication Data
US 2015/0171537 A1    Jun. 18, 2015

(30) Foreign Application Priority Data

Jun. 27, 2012 (JP) ................................. 2012-144652
Nov. 27, 2012 (JP) ................................. 2012-259142

(51) Int. Cl.
*B32B 15/01* (2006.01)
*H01R 13/03* (2006.01)
(Continued)

(52) U.S. Cl.
CPC ............. *H01R 13/03* (2013.01); *B32B 15/01* (2013.01); *C23C 18/1882* (2013.01);
(Continued)

(58) Field of Classification Search
None
See application file for complete search history.

(56) References Cited

U.S. PATENT DOCUMENTS 3,648,355 A    3/1972    Shida et al.
4,529,667 A    7/1985    Shiga et al.
(Continued)

FOREIGN PATENT DOCUMENTS

EP    0033644 A1    8/1981
JP    61-124597 A    6/1986
(Continued)

OTHER PUBLICATIONS

English machine translation of Ouchi et al. (JP 4601670), EPO, accessed Aug. 23, 2017.*
(Continued)

*Primary Examiner* — Humera N Sheikh
*Assistant Examiner* — Xiaobei Wang
(74) *Attorney, Agent, or Firm* — Drinker Biddle & Reath LLP

(57) ABSTRACT

The present invention provides metallic materials for electronic components, having low degree of whisker formation, low adhesive wear property and high durability, and connector terminals, connectors and electronic components using such metallic materials. The metallic material for
(Continued)

electronic components includes: a base material; a lower layer formed on the base material, the lower layer being constituted with one or two or more selected from a constituent element group A, namely, the group consisting of Ni, Cr, Mn, Fe, Co and Cu; an intermediate layer formed on the lower layer, the intermediate layer being constituted with one or two or more selected from a constituent element group B, namely, the group consisting of Ag, Au, Pt, Pd, Ru, Rh, Os and Ir; an upper layer formed on the intermediate layer, the upper layer being constituted with an alloy composed of one or two or more selected from the constituent element group B, namely, the group consisting of Ag, Au, Pt, Pd, Ru, Rh, Os and Ir and one or two selected from a constituent element group C, namely, the group consisting of Sn and In; an outermost layer formed on the upper layer, the upper layer being constituted with one or two selected from the constituent element group C, namely, the group consisting of Sn and In, wherein the thickness of the lower layer is 0.05 μm or more and less than 5.00 μm; the thickness of the intermediate layer is 0.01 μm or more and less than 0.50 μm; the thickness of the upper layer is less than 0.50 μm; and the thickness of the outermost layer is 0.005 μm or more and less than 0.30 μm.

22 Claims, 5 Drawing Sheets

(51) Int. Cl.
  *H05K 1/18* (2006.01)
  *C23C 18/18* (2006.01)
  *H01R 12/71* (2011.01)
(52) U.S. Cl.
  CPC .......... *H01R 12/716* (2013.01); *H05K 1/184* (2013.01); *Y10T 428/12681* (2015.01); *Y10T 428/12708* (2015.01); *Y10T 428/12715* (2015.01)

(56) References Cited

U.S. PATENT DOCUMENTS

| | | | |
|---|---|---|---|
| 5,075,176 A | 12/1991 | Brinkmann | |
| 6,403,234 B1* | 6/2002 | Kodama | B32B 15/01 428/610 |
| 6,548,898 B2 | 4/2003 | Matsuki et al. | |
| 7,147,933 B2 | 12/2006 | Strobel | |
| 7,808,109 B2 | 10/2010 | Chen et al. | |
| 7,922,545 B2 | 4/2011 | Saitoh | |
| 8,426,742 B2 | 4/2013 | Ejiri et al. | |
| 2002/0064676 A1* | 5/2002 | Bokisa | C23C 18/1651 428/645 |
| 2004/0038072 A1* | 2/2004 | Miura | H01L 23/49582 428/668 |
| 2004/0161626 A1 | 8/2004 | Kwon et al. | |
| 2005/0106408 A1* | 5/2005 | Chen | C23C 2/02 428/629 |
| 2005/0176267 A1 | 8/2005 | Saitoh | |
| 2006/0292847 A1 | 12/2006 | Schetty | |
| 2008/0188100 A1* | 8/2008 | Saitoh | H01R 12/585 439/82 |
| 2010/0255735 A1* | 10/2010 | Moriuchi | C23C 18/42 439/886 |
| 2011/0012497 A1 | 1/2011 | Sumiya et al. | |
| 2011/0236712 A1 | 9/2011 | Masago et al. | |
| 2012/0009496 A1 | 1/2012 | Shibuya | |
| 2012/0107639 A1* | 5/2012 | Takamizawa | C25D 5/10 428/620 |
| 2014/0329107 A1 | 11/2014 | Shibuya et al. | |
| 2015/0147924 A1 | 5/2015 | Shibuya et al. | |
| 2015/0171537 A1 | 6/2015 | Shibuya et al. | |
| 2015/0194746 A1 | 7/2015 | Shibuya et al. | |
| 2015/0295333 A1 | 10/2015 | Shibuya et al. | |

FOREIGN PATENT DOCUMENTS

| | | |
|---|---|---|
| JP | 01-306574 A | 12/1989 |
| JP | 02-301573 A | 12/1990 |
| JP | 04-160200 A | 6/1992 |
| JP | 04-370613 A | 12/1992 |
| JP | 05-311495 A | 11/1993 |
| JP | 09-078287 A | 3/1997 |
| JP | 11-121075 A | 4/1999 |
| JP | 11-229178 A | 8/1999 |
| JP | 11-350188 A | 12/1999 |
| JP | 11-350189 A | 12/1999 |
| JP | 2003-129278 A | 5/2003 |
| JP | 2004-079486 A | 3/2004 |
| JP | 2004-176107 A | 6/2004 |
| JP | 2004-190065 A | 7/2004 |
| JP | 2005-126763 A | 5/2005 |
| JP | 2005-226089 A | 8/2005 |
| JP | 2005-353542 A | 12/2005 |
| JP | 2006127939 A | 5/2006 |
| JP | 2006-152389 A | 6/2006 |
| JP | 2008-021501 A | 1/2008 |
| JP | 2010-138452 A | 6/2010 |
| JP | 2010-262861 A | 11/2010 |
| JP | 2011-012320 A | 1/2011 |
| JP | 2011-026677 A | 2/2011 |
| JP | 2011-122234 A | 6/2011 |
| JP | 2012-036436 A | 2/2012 |
| WO | 2005038989 A2 | 4/2005 |
| WO | WO2007/029589 * | 3/2007 |
| WO | 2010119489 A1 | 10/2010 |
| WO | 2011/001737 A1 | 1/2011 |

OTHER PUBLICATIONS

Superior Processing, "Tin/Gold Plating", May 1, 2011, <http://www.superior-processing.com/tingoldplating.html>, accessed via web.archive.org (Year: 2011).*
Office Action dated Aug. 22, 2016 in U.S. Appl. No. 14/346,075.
Office Action dated Aug. 22, 2016 in U.S. Appl. No. 14/432,978.
Extended European Search Report for European Application No. EP13809664.9 dated Feb. 2, 2016.
Office Action for U.S. Appl. No. 14/346,025 dated Oct. 29, 2015.
Office Action for U.S. Appl. No. 14/432,978 dated Oct. 27, 2015.
Office Action for U.S. Appl. No. 14/375,333 dated Aug. 14, 2015.
Office Action of U.S. Appl. No. 13/818,455, dated May 16, 2016.
Office Action of U.S. Appl. No. 14/375,333, dated Oct. 20, 2016.
International Search Report dated Aug. 29, 2013 (PCT/JP2013/067728).
Office Action for U.S. Appl. No. 14/375,333 dated Mar. 28, 2016.

* cited by examiner

METALLIC MATERIAL FOR ELECTRONIC COMPONENTS AND METHOD FOR PRODUCING SAME, AND CONNECTOR TERMINALS, CONNECTORS AND ELECTRONIC COMPONENTS USING SAME

TECHNICAL FIELD

The present invention relates to a metallic material for electronic components and a method for producing the same, and connector terminals, connectors and electronic components using the same.

BACKGROUND ART

In connectors as connecting components for electronic devices for consumer use and for vehicle use, materials are used in which base plating of Ni or Cu is applied to the surface of brass or phosphor bronze materials and Sn or Sn alloy plating is further applied to the base plating. Sn or Sn alloy plating is generally required to have properties such as low contact resistance and high solder wettability, and further, recently the reduction of the insertion force has also been required at the time of joining together a male terminal and a female terminal molded by press processing of plating materials. In the production process, on the plating surface, there occur sometimes whiskers, which are needle crystals, causing problems such as short circuiting, and hence such whiskers are also required to be suppressed satisfactorily.

In this regard, Patent Literature 1 discloses an electrical contact material including a contact base material, a ground layer composed of Ni or Co, or an alloy of both of Co and Ni and formed on the surface of the contact base material, and an Ag—Sn alloy layer formed on the surface of the ground layer, wherein the average concentration of Sn in the Ag—Sn alloy layer is less than 10 mass %, and the concentration of Sn in the Ag—Sn alloy layer is varied with a concentration gradient so as to increase from the interface with the ground layer toward the surface layer portion of the Ag—Sn alloy layer. According to Patent Literature 1, an electrical contact material excellent in wear resistance, corrosion resistance and processability is described, and the electrical contact material is described to be able to be produced with an extremely low cost.

Patent Literature 2 discloses a material for electric/electronic components wherein on the surface of a substrate having a surface composed of Cu or a Cu alloy, through the intermediary of an intermediate layer composed of a Ni layer or a Ni alloy layer, a surface layer composed of a Sn layer or a Sn alloy layer is formed, each of these layers containing an $Ag_3Sn$ (ε phase) compound and having a thickness of 0.5 to 20 μm. As described in Patent Literature 2, an object of the invention described in Patent Literature 2 is to provide a material for electrical/electronic components, wherein the surface layer is lower in melting point than Sn, excellent in solderability, and free from the occurrence of whisker; the joint strength of the junction formed after soldering is high and at the same time the temporal degradation of the joint strength at high temperatures is hardly caused, and hence the material is suitable for a lead material; even when the material is used in a high-temperature environment, the increase of the contact resistance is suppressed, the material does not cause the degradation of the connection reliability with the counterpart member, and hence the material is suitable as a contact material, the object also including the provision of a method for producing the above-described material, and the provision of electrical/electronic components using the above-described material.

Patent Literature 3 discloses a covering material including a base material having electrically conductive property and a covering layer formed on the base material, wherein the covering layer includes an intermetallic compound of Sn and a precious metal at least on the surface side thereof. Patent Literature 3 describes an object thereof is to provide a covering material being low in contact resistance, having a low friction coefficient so as to be effective in reduction of insertion force, being excellent in oxidation resistance and having stable properties over a long period of time, and a method for producing the covering material.

CITATION LIST

Patent Literature

[Patent Literature 1] Japanese Patent Laid-Open No. Hei 4-370613
[Patent Literature 2] Japanese Patent Laid-Open No. Hei 11-350189
[Patent Literature 3] Japanese Patent Laid-Open No. 2005-126763

SUMMARY OF INVENTION

Technical Problem

However, the technique described in Patent Literature 1 has not revealed the relation to the recently required reduction of the insertion force and the relation to the occurrence and nonoccurrence of the whiskers. The average concentration of Sn in the Ag—Sn alloy layer is less than 10 mass %, and the proportion of Ag in the Ag—Sn alloy layer is considerably large, and hence the gas corrosion resistance against the gases such as chlorine gas, sulfurous acid gas and hydrogen sulfide is not sufficient according to the evaluation performed by the present inventors.

In the technique described in Patent Literature 2, a surface layer is involved which is formed of a Sn layer or a Sn-alloy layer including an $Ag_3Sn$ (ε-phase) compound and having a thickness of 0.5 to 20 μm, and according to the evaluation performed by the present inventors, this surface layer thickness has resulted in the occurrence of areas incapable of sufficiently reducing the insertion force. The content of the $Ag_3Sn$ (ε-phase) of the surface layer formed of a Sn layer or a Sn-alloy layer is also described to be 0.5 to 5% by mass in terms of Ag, the proportion of Sn in the surface layer formed of a Sn layer or a Sn-alloy layer is large, the thickness of the surface layer formed of a Sn layer or a Sn-alloy layer, and hence, according to the evaluation performed by the present inventors, whiskers occurred and the fine sliding wear resistance was not sufficient. The heat resistance and the solder wettability were also not sufficient.

In the technique described in Patent Literature 3, the covering layer includes an intermetallic compound of Sn and a precious metal, the thickness of the intermetallic compound ($Ag_3Sn$) of Sn and a precious metal is preferably set at 1 μm or more and 3 μm or less. According to the evaluation performed by the present inventors, this thickness was found to be unable to sufficiently decrease the insertion force.

As described above, electronic component metallic materials having a conventional Sn—Ag alloy/Ni base plating structure still cannot sufficiently decrease the insertion force and a problem has been left unsolved in that whiskers occur.

For the durability (heat resistance, solder wettability, fine sliding wear resistance and gas corrosion resistance), it is difficult to achieve sufficiently satisfactory specifications and such specifications have not yet been clear.

The present invention has been achieved in order to solve the above-described problems, and an object of the present invention is to provide metallic materials for electronic components, having low degree of whisker formation, low adhesive wear property and high durability, and connector terminals, connectors and electronic components using such metallic materials. Here, the adhesive wear means the wear phenomenon made to occur due to the shear, caused by frictional movement, of the adhesive portions constituting the real contact area between solid objects. With the increase of the adhesive wear, the insertion force is increased when a male terminal and a female terminal are joined together.

Solution to Problem

The present inventors made a diligent study, and consequently have discovered that a metallic material for electronic components, having low degree of whisker formation, low adhesive wear property and high durability can be prepared by disposing a lower layer, an intermediate layer and an upper layer on a base material, by using predetermined metals for the lower layer, the intermediate layer and the upper layer, respectively, and by assigning predetermined thickness values and predetermined compositions to the lower, intermediate and upper layers, respectively.

An aspect of the present invention perfected on the basis of the above-described discovery is a metallic material for electronic components having low degree of whisker formation, low adhesive wear property and high durability, the metallic material for electronic components comprising: a base material; a lower layer formed on the base material, the lower layer being constituted with one or two or more selected from a constituent element group A, namely, the group consisting of Ni, Cr, Mn, Fe, Co and Cu; an intermediate layer formed on the lower layer, the intermediate layer being constituted with one or two or more selected from a constituent element group B, namely, the group consisting of Ag, Au, Pt, Pd, Ru, Rh, Os and Ir; an upper layer formed on the intermediate layer, the upper layer being constituted with an alloy composed of one or two or more selected from the constituent element group B, namely, the group consisting of Ag, Au, Pt, Pd, Ru, Rh, Os and Ir and one or two selected from a constituent element group C, namely, the group consisting of Sn and In; and an outermost layer formed on the upper layer, the outermost layer being constituted with one or two selected from the constituent element group C, namely, the group consisting of Sn and In, wherein the thickness of the lower layer is 0.05 μm or more and less than 5.00 μm; the thickness of the intermediate layer is 0.01 μm or more and less than 0.50 μm; the thickness of the upper layer is less than 0.50 μm; the thickness of the outermost layer is 0.005 μm or more and less than 0.30 μm.

In the metallic material for electronic components of the present invention in an embodiment, the minimum thickness (μm) of the outermost layer is 50% or more of the thickness (μm) of the outermost layer.

In the metallic material for electronic components of the present invention in another embodiment, the maximum value (μm) of the elevation differences between the adjacent hills and valleys in the profile of the interface between the outermost layer and the upper layer is 50% or less of the thickness (μm) of the outermost layer.

In the metallic material for electronic components of the present invention in yet another embodiment, the upper layer includes the metal(s) of the constituent element group C in a content of 10 to 50 at %.

In the metallic material for electronic components of the present invention in yet another embodiment, in the upper layer, a ζ (zeta)-phase being a Sn—Ag alloy including Sn in a content of 11.8 to 22.9 at % is present.

In the metallic material for electronic components of the present invention in yet another embodiment, in the upper layer, an ε (epsilon)-phase being $Ag_3Sn$ is present.

In the metallic material for electronic components of the present invention in yet another embodiment, in the upper layer, a ζ (zeta)-phase being a Sn—Ag alloy including Sn in a content of 11.8 to 22.9 at % and an ε (epsilon)-phase being $Ag_3Sn$ are present.

In the metallic material for electronic components of the present invention in yet another embodiment, in the upper layer, only the ε (epsilon)-phase being $Ag_3Sn$ is present.

In the metallic material for electronic components of the present invention in yet another embodiment, in the upper layer, the ε (epsilon)-phase being $Ag_3Sn$ and β-Sn being a Sn single phase are present.

In the metallic material for electronic components of the present invention in yet another embodiment, in the upper layer, the ζ (zeta)-phase being a Sn—Ag alloy including Sn in a content of 11.8 to 22.9 at %, the ε (epsilon)-phase being $Ag_3Sn$ and β-Sn being a Sn single phase are present.

In the metallic material for electronic components of the present invention in yet another embodiment, the thickness of the outermost layer is less than 0.20 μm.

In the metallic material for electronic components of the present invention in yet another embodiment, the thickness of the upper layer is 0.05 μm or more.

In the metallic material for electronic components of the present invention in yet another embodiment, the thickness of the intermediate layer is 0.05 μm or more and less than 0.30 μm.

In the metallic material for electronic components of the present invention in yet another embodiment, the thickness ratio between the outermost layer and the upper layer is such that outermost layer:upper layer=1:9 to 6:4.

In the metallic material for electronic components of the present invention in yet another embodiment, in the range from the outermost layer to the intermediate layer, exclusive of the range of 0.03 μm from the outermost surface of the outermost layer, C, S and O are each included in a content of 2 at % or less.

In the metallic material for electronic components of the present invention in yet another embodiment, the indentation hardness of the surface of the outermost layer, namely, the hardness obtained by hitting a dent on the surface of the outermost layer with a load of 10 mN on the basis of a nanoindentation hardness test is 1000 MPa or more.

In the metallic material for electronic components of the present invention in yet another embodiment, the indentation hardness measured from the surface of the outermost layer, namely, the hardness obtained by hitting a dent on the surface of the outermost layer with a load of 10 mN on the basis of a nanoindentation hardness test is 10000 MPa or less.

In the metallic material for electronic components of the present invention, in yet another embodiment thereof, the arithmetic mean height (Ra) of the surface of the outermost layer is 0.3 μm or less.

In the metallic material for electronic components of the present invention, in yet another embodiment thereof, the maximum height (Rz) of the surface of the outermost layer is 3 μm or less.

In the metallic material for electronic components of the present invention in yet another embodiment, the outermost layer, the upper layer, the intermediate layer and the lower layer are formed, by forming a film of one or two or more selected from the constituent element group A on the base material, then forming a film of one or two selected from the constituent element group B, then forming a film of one or two or more selected from the constituent element group C, and by diffusion of the respective selected elements of the constituent element group B and the constituent element group C.

In the metallic material for electronic components of the present invention in yet another embodiment, the diffusion is performed by heat treatment.

In the metallic material for electronic components of the present invention in yet another embodiment, the heat treatment is performed at a temperature equal to higher than the melting point(s) of the metal(s) of the constituent element group C, an alloy layer of one or two or more selected from the constituent element group B and one or two selected from the constituent element group C are formed.

In the metallic material for electronic components of the present invention in yet another embodiment, the content of the metal(s) of the constituent element group A is 50% by mass or more in terms of the total content of Ni, Cr, Mn, Fe, Co and Cu, and one or two or more selected from the group consisting of B, P, Sn and Zn are further included.

In the metallic material for electronic components of the present invention in yet another embodiment, the content of the metal(s) of the constituent element group B is 50% by mass or more in terms of the total content of Ag, Au, Pt, Pd, Ru, Rh, Os and Ir, and the rest alloy component is composed of one or two or more selected from the group consisting of Bi, Cd, Co, Cu, Fe, In, Mn, Mo, Ni, Pb, Sb, Se, Sn, W, Tl and Zn.

In the metallic material for electronic components of the present invention in yet another embodiment, the content of the metal(s) of the constituent element group C is 50% by mass or more in terms of the total content of Sn and In, and the rest alloy component is composed of one or two or more selected from the group consisting of Ag, As, Au, Bi, Cd, Co, Cr, Cu, Fe, Mn, Mo, Ni, Pb, Sb, W and Zn.

In the metallic material for electronic components of the present invention, in yet another embodiment thereof, the Vickers hardness of the cross section of the lower layer is Hv 300 or more.

In the metallic material for electronic components of the present invention in yet another embodiment, the indentation hardness of the cross section of the lower layer, namely, the hardness obtained by hitting a dent on the cross section of the lower layer with a load of 10 mN on the basis of a nanoindentation hardness test is 1500 MPa or more.

In the metallic material for electronic components of the present invention, in yet another embodiment thereof, the Vickers hardness of the cross section of the lower layer is Hv 1000 or less.

In the metallic material for electronic components of the present invention in yet another embodiment, the indentation hardness of the cross section of the lower layer, namely, the hardness obtained by hitting a dent on the cross section of the lower layer with a load of 10 mN on the basis of a nanoindentation hardness test is 10000 MPa or less.

In the metallic material for electronic components of the present invention in yet another embodiment, P is deposited on the surface of the outermost layer, and the deposition amount of P is $1\times10^{-11}$ to $4\times10^{-8}$ mol/cm$^2$.

In the metallic material for electronic components of the present invention in yet another embodiment, N is further deposited on the surface of the outermost layer, and the deposition amount of N is $2\times10^{-12}$ to $8\times10^{-9}$ mol/cm$^2$.

In the metallic material for electronic components of the present invention in yet another embodiment, in the XPS analysis performed for the outermost layer, with I(P2s) denoting the photoelectron detection intensity due to the 2S orbital electron of P to be detected and I(N1s) denoting the photoelectron detection intensity due to the 1S orbital electron of N to be detected, the relation $0.1 \leq I(P2s)/I(N1s) \leq 1$ is satisfied.

In the metallic material for electronic components of the present invention in yet another embodiment, in the XPS analysis performed for the outermost layer, with I(P2s) denoting the photoelectron detection intensity due to the 2S orbital electron of P to be detected and I(N1s) denoting the photoelectron detection intensity due to the 1S orbital electron of N to be detected, the relation $1 < I(P2s)/I(N1s) \leq 50$ is satisfied.

Another aspect of the present invention is a method for producing the metallic material for electronic components, the metallic material comprising: a base material; a lower layer formed on the base material, the lower layer being constituted with one or two or more selected from a constituent element group A, namely, the group consisting of Ni, Cr, Mn, Fe, Co and Cu; an intermediate layer formed on the lower layer, the intermediate layer being constituted with one or two or more selected a constituent element group B, namely, the group consisting of Ag, Au, Pt, Pd, Ru, Rh, Os and Ir; an upper layer formed on the intermediate layer, the upper layer being constituted with an alloy composed of one or two or more selected from the constituent element group B, namely, the group consisting of Ag, Au, Pt, Pd, Ru, Rh, Os and Ir and one or two selected from a constituent element group C, namely, the group consisting of Sn and In; and an outermost layer formed on the upper layer, the upper layer being constituted with one or two selected from the constituent element group C, namely, the group consisting of Sn and In, wherein the surface of the metallic material is surface-treated with a phosphoric acid ester-based solution including at least one of the phosphoric acid esters represented by the following general formulas [1] and [2], and at least one selected from the group of the cyclic organic compounds represented by the following general formulas [3] and [4]:

[Formula 1]

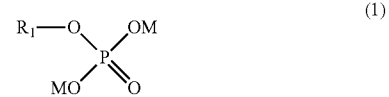
(1)

[Formula 2]

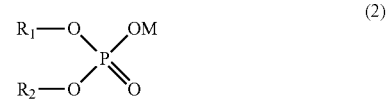
(2)

(wherein, in formulas [1] and [2], $R_1$ and $R_2$ each represent a substituted alkyl group and M represents a hydrogen atom or an alkali metal atom)

[Formula 3]

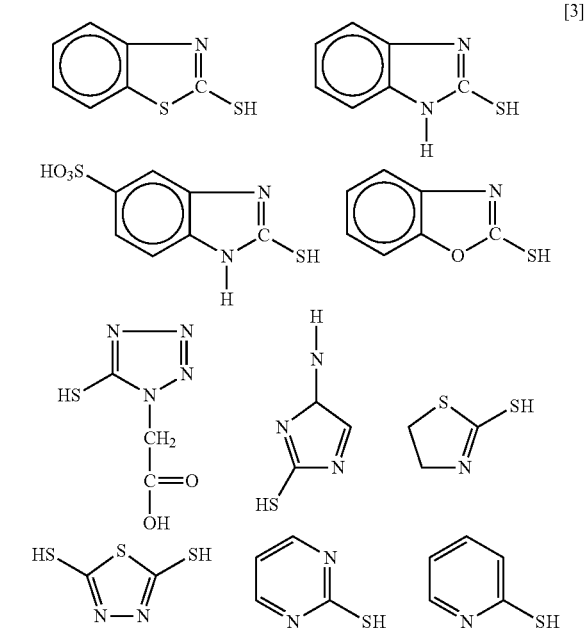

[3]

[Formula 4]

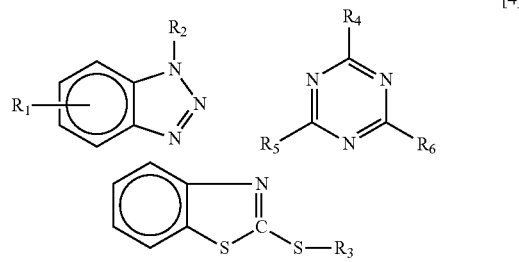

[4]

(wherein, in formulas [3] and [4], $R_1$ represents a hydrogen atom, an alkyl group or a substituted alkyl group; $R_2$ represents an alkali metal atom, a hydrogen atom, an alkyl group or a substituted alkyl group; $R_3$ represents an alkali metal atom or a hydrogen atom; $R_4$ represents —SH, an alkyl group-substituted or aryl group-substituted amino group, or represents an alkyl-substituted imidazolylalkyl group; and $R_5$ and $R_6$ each represent —$NH_2$, —SH or —SM (M represents an alkali metal atom).)

In the method for producing metallic material for electronic components of the present invention in an embodiment, the surface treatment with the phosphoric acid ester-based solution is performed by applying the phosphoric acid ester-based solution to the outermost layer.

In the method for producing metallic material for electronic components of the present invention in another embodiment, the surface treatment with the phosphoric acid ester-based solution is performed by conducting an electrolysis by immersing the metallic material after the formation of the outermost layer in the phosphoric acid ester-based solution and using as the anode the metallic material after the formation of the outermost layer.

The present invention is, in yet another aspect thereof, a connector terminal using, in the contact portion thereof, the metallic material for electronic components of the present invention.

The present invention is, in yet another aspect thereof, a connector using the connector terminal of the present invention.

The present invention is, in yet another aspect thereof, an FFC terminal using, in the contact portion thereof, the metallic material for electronic components of the present invention.

The present invention is, in yet another aspect thereof, an FPC terminal using, in the contact portion thereof, the metallic material for electronic components of the present invention.

The present invention is, in yet another aspect thereof, an FFC using the FFC terminal of the present invention.

The present invention is, in yet another aspect thereof, an FPC using the FPC terminal of the present invention.

The present invention is, in yet another aspect thereof, an electronic component using, in the electrode thereof for external connection, the metallic material for electronic components of the present invention.

The present invention is, in yet another aspect thereof, an electronic component using the metallic material for electronic components of the present invention, in a push-in type terminal thereof for fixing a board connection portion to a board by pushing the board connection portion into the through hole formed in the board, wherein a female terminal connection portion and the board connection portion are provided respectively on one side and the other side of a mounting portion to be attached to a housing.

Advantageous Effects of Invention

According to the present invention, it is possible to provide metallic materials for electronic components, having low degree of whisker formation, low adhesive wear property and high durability, and connector terminals, connectors and electronic components using such metallic materials.

DESCRIPTION OF EMBODIMENTS

Figure 1:
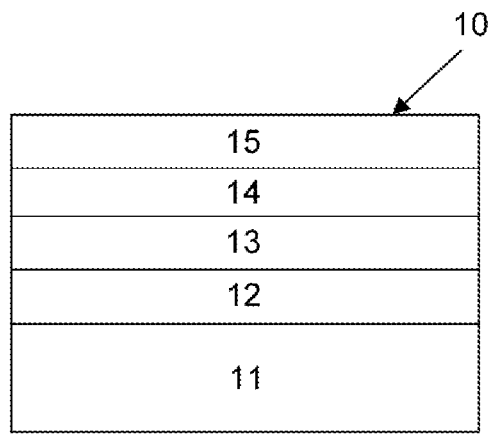
FIG. 1 is a schematic diagram illustrating the structure of a metallic material for electronic components according to an embodiment of the present invention.

Hereinafter, the metallic materials for electronic components according to the embodiments of the present invention are described. As shown in FIG. 1, the metallic material 10 for electronic components according to an embodiment includes a base material 11, an lower layer 12 formed on the base material 11, an intermediate layer 13 formed on the lower layer 12, an upper layer 14 formed on the intermediate layer 13 and an outermost layer 15 formed on the upper layer 14.

<Structure of Metallic Material for Electronic Components>

(Base Material)

Usable examples of the base material 11 include, without being particularly limited to: metal base materials such as copper and copper alloys, Fe-based materials, stainless steel, titanium and titanium alloys and aluminum and aluminum alloys. The base material 11 may be formed by combining a metal base material with a resin layer. Examples of the base material formed by combining a metal base material with a resin layer include the electrode portions in FPC and FFC base materials.

(Outermost Layer)

The outermost layer 15 is required to be constituted with one or two selected from a constituent element group C, namely, the group consisting of Sn and In.

Sn and In are oxidizable metals, but are characterized by being relatively soft among metals. Accordingly, even when an oxide film is formed on the surface of Sn or In, for example at the time of joining together a male terminal and a female terminal by using a metallic material for electronic components as a contact material, the oxide film is easily scraped to result in contact between metals, and hence a low contact resistance is obtained.

Sn and In are excellent in the gas corrosion resistance against the gases such as chlorine gas, sulfurous acid gas and hydrogen sulfide gas; for example, when Ag poor in gas corrosion resistance is used for the intermediate layer 13, Ni poor in gas corrosion resistance is used for the lower layer 12, and copper or a copper alloy poor in gas corrosion resistance is used for the base material 11, Sn and In have an effect to improve the gas corrosion resistance of the metallic material for electronic components. As for Sn and In, Sn is preferable because In is severely regulated on the basis of the technical guidelines for the prevention of health impairment prescribed by the Ordinance of Ministry of Health, Labour and Welfare.

The thickness of the outermost layer 15 is required to be 0.005 µm or more and less than 0.30 µm. When the thickness of the outermost layer 15 is less than 0.005 µm, for example, in the case where the metal of the constituent element group B is Ag, the gas corrosion resistance is poor, and there occurs a problem that the exterior appearance is discolored when a gas corrosion test is performed. When the thickness of the outermost layer 15 is 0.30 µm or more, the adhesive wear of Sn or In is increased, the insertion force is increased, and there occurs a problem that whiskers tend to occur. The fine sliding wear resistance is also poor, and fine sliding increases the contact resistance. The thickness of the outermost layer 15 is preferably less than 0.20 µm.

(Upper Layer)

The upper layer 14 is required to be constituted with an alloy composed of one or two or more selected from the constituent element group B, namely, the group consisting of Ag, Au, Pt, Pd, Ru, Rh, Os and Ir and one or two selected from the constituent element group C, namely, the group consisting of Sn and In.

The metal(s) of the group consisting of Ag, Au, Pt, Pd, Ru, Rh, Os and Ir forms a compound(s) with Sn or In, and hence the formation of the oxide film of Sn or In is suppressed, and the solder wettability is improved. Among Ag, Au, Pt, Pd, Ru, Rh, Os and Ir, Ag is more desirable from the viewpoint of electrical conductivity. Ag is high in electrical conductivity. For example, when Ag is used for high-frequency wave signals, impedance resistance is made low due to the skin effect.

The thickness of the upper layer 14 is required to be less than 0.50 µm. When the thickness of the upper layer 14 is 0.50 µm or more, the thin film lubrication effect due to the hard base material 11 or the hard lower layer 12 is degraded and the adhesive wear is increased. The mechanical durability is also degraded and scraping of plating tends to occur. On the other hand, the thickness of the upper layer 14 is preferably 0.05 µm or more. When the thickness of the upper layer is less than 0.05 µm, for example, in the case where metal of the constituent element group B is Ag, the gas corrosion resistance is poor, and sometimes the exterior appearance is discolored when a gas corrosion test is performed.

The upper layer 14 preferably includes the metal(s) of the constituent element group C in a content of 10 to 50 at %. When the content of the metal(s) of the constituent element group C is less than 10 at %, for example, in the case where the metal of the constituent element group B is Ag, the gas corrosion resistance is poor, and sometimes the exterior appearance is discolored when a gas corrosion test is performed. On the other hand, when the content of the metal(s) of the constituent element group C exceeds 50 at %, the proportion of the metal(s) of the constituent element group C in the upper layer 14 is large, and hence the adhesive wear is increased and whiskers also tend to occur. Moreover, the fine sliding wear resistance is sometimes poor.

In the upper layer 14, the ζ (zeta)-phase being a Sn—Ag alloy including Sn in a content of 11.8 to 22.9 at % is preferably present. By the presence of the ζ (zeta)-phase, the gas corrosion resistance is improved, and the exterior appearance is hardly discolored even when the gas corrosion test is performed.

In the upper layer 14, the ζ (zeta)-phase and the ε (epsilon)-phase being $Ag_3Sn$ are preferably present. By the presence of the ε (epsilon)-phase, as compared with the case where only the ζ (zeta)-phase is present in the upper layer 14, the coating becomes harder and the adhesive wear is decreased. The increase of the proportion of Sn in the upper layer 14 improves the gas corrosion resistance.

In the upper layer 14, preferably only the ε (epsilon)-phase being $Ag_3Sn$ is present. By the sole presence of the ε (epsilon)-phase in the upper layer 14, the coating becomes further harder and the adhesive wear is decreased as compared with the case where the ζ (zeta)-phase and the ε (epsilon)-phase being $Ag_3Sn$ are present in the upper layer 14. The more increase of the proportion of Sn in the upper layer 14 also improves the gas corrosion resistance.

The presence of the ε (epsilon)-phase being $Ag_3Sn$ and the β-Sn being a Sn single phase in the upper layer 14 is preferable. By the presence of the ε (epsilon)-phase being $Ag_3Sn$ and β-Sn being a Sn single phase, the gas corrosion resistance is improved with a further increase of the proportion of Sn in the upper layer as compared with the case where only the ε (epsilon)-phase is present in the upper layer 14.

In the upper layer 14, preferably the ζ (zeta)-phase being a Sn—Ag alloy including Sn in a content of 11.8 to 22.9 at %, the ε (epsilon)-phase being $Ag_3Sn$ and β-Sn being a Sn single phase are present. By the presence of the ζ (zeta)-phase, the ε (epsilon)-phase being $Ag_3Sn$ and β-Sn being a Sn single phase, the gas corrosion resistance is improved, the exterior appearance is hardly discolored even when a gas corrosion test is performed, and the adhesive wear is decreased. The constitution concerned is created by a diffusion process and involves no structure in an equilibrium state.

(Intermediate Layer)

Between the lower layer 12 and the upper layer 14, the intermediate layer 13 constituted with one or two or more selected from the constituent element group B, namely, the group consisting of Ag, Au, Pt, Pd, Ru, Rh, Os and Ir is required to be formed in a thickness of 0.01 μm or more and less than 0.50 μm. Ag, Au, Pt, Pd, Ru, Rh, Os and Ir are characterized by comparatively having heat resistance among metals. Accordingly, these metals suppress the diffusion of the composition of the base material 11 or the lower layer 12 to the side of the upper layer 14, and improve the heat resistance. Among Ag, Au, Pt, Pd, Ru, Rh, Os and Ir, Ag is more desirable from the viewpoint of electrical conductivity. Ag is high in electrical conductivity. For example, when Ag is used for high-frequency wave signals, impedance resistance is made low due to the skin effect.

The thickness of the intermediate layer 13 is required to be 0.01 μm or more and less than 0.50 μm. When the thickness of the intermediate layer 13 is less than 0.01 μm, the composition of the base material 11 or the lower layer 12 tends to diffuse to the side of the upper layer 14 and the heat resistance or the solder wettability is degraded. On the other hand, when the thickness of the intermediate layer 13 is 0.50 μm or more, the thin film lubrication effect due to the hard base material 11 or the hard lower layer 12 is degraded and the adhesive wear is increased. The mechanical durability is also degraded and scraping of plating tends to occur. The thickness of the intermediate layer 13 is preferably 0.05 μm or more and less than 0.30 μm.

(Relation Between Thickness of Outermost Layer and Minimum Thickness of Outermost Layer)

The minimum thickness (μm) of the outermost layer 15 is preferably 50% or more of the thickness (μm) of the outermost layer 15. When the minimum thickness of the outermost layer 15 is less than 50% of the thickness of the outermost layer 15, the surface roughness of the outermost layer is rough, and for example, in the case where the metal of the constituent element group B is Ag, the gas corrosion resistance is poor, and sometimes the exterior appearance is discolored when a gas corrosion test is performed.

Here, the spot for grasping the relation between the thickness of the outermost layer and the minimum thickness of the outermost layer is the average cross section of the portion exhibiting the effect of the coating of the present invention. The spot refers to the portion normally subjected to film formation processing in the normal surface profile (oil pits, etch pits, scratches, dents, and other surface defects are not included) of the material, in the portion concerned. Needless to say, the spot excludes the deformed portions or the like due to the press processing before and after the film formation.

(Relation Between Thickness of Outermost Layer and Maximum Value of Elevation Differences Between Adjacent Hills and Valleys in Profile of Interface Between Outermost Layer and Upper Layer)

The maximum value (μm) of the elevation differences between the adjacent hills and valleys in the profile of the interface between the outermost layer 15 and the upper layer 14 preferably accounts for 50% or less of the thickness (μm) of the outermost layer 15. When the maximum value (μm) of the elevation differences between the adjacent hills and valleys in the profile of the interface between the outermost layer 15 and the upper layer 14 exceeds 50% of the thickness of the outermost layer 15, the upper layer 14 is to be positioned near the outermost layer 15, and for example, in the case where the metal of the constituent element group B is Ag, the gas corrosion resistance is poor, and sometimes the exterior appearance is discolored when a gas corrosion test is performed.

The microscopic distribution of the thickness of the outermost layer 15 and the profile of the interface between the outermost layer 15 and the upper layer 14 can be controlled by the film formation conditions of the lower layer 12, intermediate layer 13, upper layer 14 and outermost layer 15. At the time of film formation, by regulating the plating conditions (metal concentration, additives, cathode current density, stirring and the like), smooth electrodeposition film formation is performed so as to satisfy the above-described "relation between the thickness of the outermost layer and the minimum thickness of the outermost layer," and the above-described "relation between the thickness of the outermost layer and the maximum value of the elevation differences between the adjacent hills and valleys in the profile of the interface between the outermost layer and the upper layer."

(Thickness Ratio Between Outermost Layer and Upper Layer)

The thickness ratio between the outermost layer 15 and the upper layer 14 preferably satisfies the condition of outermost layer:upper layer=1:9 to 6:4. When in the ratio, outermost layer:upper layer, the proportion of the outermost layer 15 is less than "outermost layer:upper layer=1:9," for example, in the case where the metal of the constituent element group B is Ag, the gas corrosion resistance is poor, and sometimes the exterior appearance is discolored when a gas corrosion test is performed. On the other hand, when in the ratio, outermost layer:upper layer, the proportion of the outermost layer 15 is larger than "outermost layer:upper layer=6:4," the adhesive wear of Sn or In comes to be large, the insertion force comes to be large, whiskers also occur, and sometimes there occurs a problem that the fine sliding wear resistance is degraded.

In the range from the outermost layer 15 to the intermediate layer 13, exclusive of the range of 0.03 μm from the outermost surface of the outermost layer 15, C, S and O are each included preferably in a content of 2 at % or less. When the content of each of C, S and O is larger than 2 at %, these co-deposited elements are gasified in the application of heat treatment, and no uniform alloy coating may be able to be formed.

(Lower Layer)

Between the base material 11 and the upper layer 14, it is necessary to form the lower layer 12 constituted with one or two or more selected from the constituent element group A, namely, the group consisting of Ni, Cr, Mn, Fe, Co and Cu. By forming the lower layer 12 with one or two or more metals selected from the constituent element group A, namely, the group consisting of Ni, Cr, Mn, Fe, Co and Cu, the hard lower layer 12 is formed, hence the thin film lubrication effect is improved and the adhesive wear is decreased, and the lower layer 12 prevents the diffusion of the constituent metal(s) of the base material 11 into the upper layer 14 and improves, for example, the heat resistance or the solder wettability.

The thickness of the lower layer 12 is required to be 0.05 μm or more. When the thickness of the lower layer 12 is less than 0.05 μm, the thin film lubrication effect due to the hard lower layer is degraded and the adhesive wear is increased. The diffusion of the constituent metal(s) of the base material 11 into the upper layer 14 is facilitated, and the heat resistance or the solder wettability is degraded. On the other hand, the thickness of the lower layer 12 is required to be less than 5.00 µm. When the thickness is 5.00 µm or more, bending processability is poor.

(Constituent Element Group A)

The metal(s) of the constituent element group A includes Ni, Cr, Mn, Fe, Co and Cu in the total amount of these of 50 mass % or more, and may further include one or two or more selected from the group consisting of B, P, Sn and Zn. The alloy composition of the lower layer 12 having such a constitution as described above makes the lower layer 12 harder and further improves the thin film lubrication effect to further decrease the adhesive wear; the alloying of the lower layer 12 further prevents the diffusion of the constituent metals of the base material 11 into the upper layer, and sometimes improves the durability such as the heat resistance and the solder wettability in such a way.

(Constituent Element Group B)

The content of the metal(s) of the constituent element group B is 50% by mass or more in terms of the total content of Ag, Au, Pt, Pd, Ru, Rh, Os and Ir, and the rest alloy component may be composed of one or two or more selected from the group consisting of Bi, Cd, Co, Cu, Fe, In, Mn, Mo, Ni, Pb, Sb, Se, Sn, W, Tl and Zn. Sometimes, these metals further decreases the adhesive wear, suppresses the occurrence of whisker, and additionally improves the durability such as the heat resistance or the solder wettability.

(Constituent Element Group C)

The content of the metal(s) of the constituent element group C is 50% by mass or more in terms of the total content of Sn and In, and the rest alloy component may be composed of one or two or more selected from the group consisting of Ag, As, Au, Bi, Cd, Co, Cr, Cu, Fe, Mn, Mo, Ni, Pb, Sb, W and Zn. Sometimes, these metals further decreases the adhesive wear, suppresses the occurrence of whisker, and additionally improves the durability such as the heat resistance or the solder wettability.

(Diffusion Treatment)

The outermost layer 15, the upper layer 14, the intermediate layer 13 and the lower layer 12 may be formed, by forming a film of one or two or more selected from the constituent element group A on the base material, then forming a film of one or two selected from the constituent element group B, then forming a film of one or two or more selected from the constituent element group C, and by diffusion of the respective selected elements of the constituent element group B and the constituent element group C. For example, when the metal from the constituent element group B is Ag and the metal from the constituent element group C is Sn, the diffusion of Ag into Sn is fast, and thus a Sn—Ag alloy layer is formed by spontaneous diffusion of Sn. The formation of the alloy layer can further reduce the adhesion force of Sn, and the low degree of whisker formation and the durability can also be further improved.

(Heat Treatment)

After the formation of the upper outermost 15, a heat treatment may be applied for the purpose of further suppressing the adhesive wear and further improving the low degree of whisker formation and the durability. The heat treatment allows the metal(s) of the constituent element group B and the metal(s) of the constituent element layer C of the upper layer to form an alloy layer more easily, also allows the metal(s) of the constituent element group A and the metal(s) of the constituent element group B of the intermediate layer 13 to form an alloy layer more easily, further reduces the adhesion force of Sn, and can further improve the low degree of whisker formation and the durability.

For the heat treatment, the treatment conditions (temperature×time) can be appropriately selected. The heat treatment is not particularly required to be applied. When the heat treatment is applied, the heat treatment performed at a temperature equal to or higher than the highest melting point of the metal(s) selected from the constituent element group C allows one or two or more selected from the constituent element group B and one or two selected from the constituent element group C to form an alloy layer more easily.

(Post-Treatment)

To the outermost layer 15, or to the outermost layer 15 after being subjected to heat treatment, a post-treatment may be applied for the purpose of further decreasing the adhesive wear and improving the low degree of whisker formation and the durability. The post-treatment improves the lubricity, further decreases the adhesive wear, suppress the oxidation of the outermost layer 15, and can improve the durability such as the heat resistance or the solder wettability. Specific examples of the post-treatment include phosphoric acid salt treatment, lubrication treatment and silane coupling treatment using an inhibitor. For the post-treatment, the treatment conditions (temperature×time) can be appropriately selected. The post-treatment is not particularly required to be applied.

The post-treatment is preferably performed for the surface of the outermost layer 15 by using an aqueous solution (referred to as the phosphoric acid ester-based solution) including one or two or more phosphoric acid esters and one or two or more cyclic organic compounds. The phosphoric acid ester(s) added to the phosphoric acid ester-based solution plays the functions as an antioxidant for plating and a lubricant for plating. The phosphoric acid esters used in the present invention are represented by the general formula [1] and [2]. Examples of the preferable compounds among the compounds represented by the general formula [1] include lauryl acidic phosphoric acid monoester. Examples of the preferable compounds among the compounds represented by the general formula [2] include lauryl acidic phosphoric acid diester.

[Formula 5]

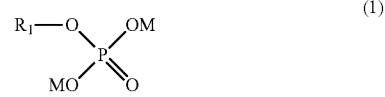

(1)

[Formula 6]

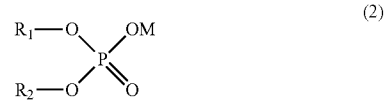

(2)

(wherein, in formulas [1] and [2], $R_1$ and $R_2$ each represent a substituted alkyl group and M represents a hydrogen atom or an alkali metal atom.)

The cyclic organic compound added to the phosphoric acid ester-based solution plays the function as an antioxidant for plating. The group of the cyclic organic compounds used in the present invention are represented by the general formula [3] and [4]. Examples of the preferable compounds among the cyclic organic compounds represented by the general formulas [3] and [4] include: mercaptobenzothiazole, Na salt of mercaptobenzothiazole, K salt of mercaptobenzothiazole, benzotriazole, 1-methyltriazole, tolyltriazole and triazine-based compounds.

[Formula 7]

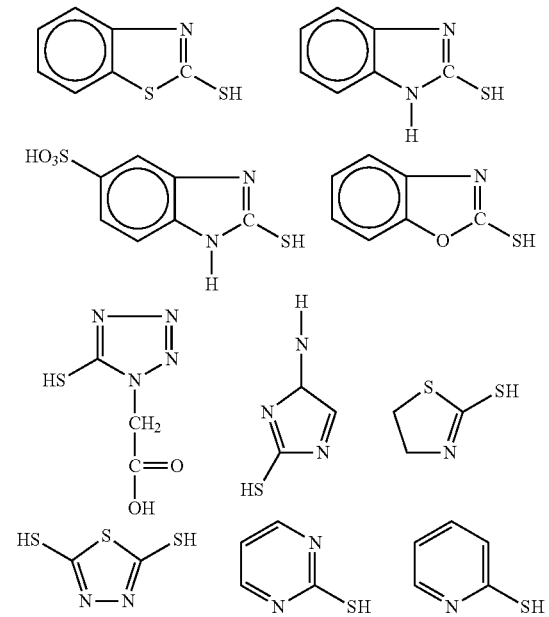

[3]

[Formula 8]

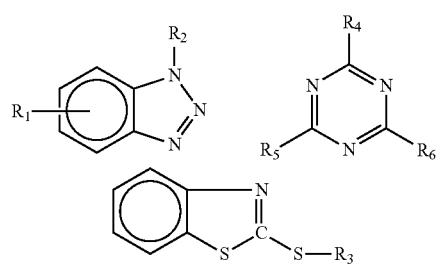

[4]

(wherein, in formulas [3] and [4], $R_1$ represents a hydrogen atom, an alkyl group or a substituted alkyl group; $R_2$ represents an alkali metal atom, a hydrogen atom, an alkyl group or a substituted alkyl group; $R_3$ represents an alkali metal atom or a hydrogen atom; $R_4$ represents —SH, an alkyl group-substituted or aryl group-substituted amino group, or represents an alkyl-substituted imidazolylalkyl group; and $R_5$ and $R_6$ each represent —$NH_2$, —SH or —SM (M represents an alkali metal atom).)

The post-treatment is furthermore preferably performed in such a way that both P and N are present on the surface of the outermost layer 15. When P is absent on the plating surface, the solderability tends to be degraded, and the lubricity of the plating material is also degraded. On the other hand, when N is absent on the Sn or Sn alloy plating surface, sometimes the contact resistance of the plating material tends to be increased in a high temperature environment.

Moreover, in the present invention, in the case where P is deposited on the surface of the outermost layer 15, when the deposition amount of P is $1 \times 10^{-11}$ to $4 \times 10^{-8}$ mol/cm$^2$, preferably the solderability is hardly degraded, the lubricity is satisfactory and the increase of the contact resistance is also reduced. In the case where N is additionally deposited on the surface of the outermost layer 15, more preferably the deposition amount of N is $2 \times 10^{-12}$ to $8 \times 10^{-9}$ mol/cm$^2$. When the deposition amount of P is less than $1 \times 10^{-11}$ mol/cm$^2$, the solder wettability tends to be degraded, and when the deposition amount of P exceeds $4 \times 10^{-8}$ mol/cm$^2$, sometimes the failure of the increase of the contact resistance occurs.

When in the XPS analysis performed for the outermost layer 15, with I(P2s) denoting the photoelectron detection intensity due to the 2S orbital electron of P to be detected and I(N1s) denoting the photoelectron detection intensity due to the 1S orbital electron of N to be detected, the relation $0.1 \leq I(P2s)/I(N1s) \leq 1$ is satisfied, sometimes the contact resistance and the solderability of the plating material is hardly degraded in a high temperature environment. When the value of I(P2s)/I(N1s) is less than 0.1, for example, the function to prevent the contact resistance degradation is not sufficient, and when the value of I(P2s)/I(N1s) exceeds 1, the contact resistance at the early stage comes to be slightly high, but, as described below, sometimes the dynamic friction coefficient of the plating material comes to be small. In this case, I(P2s) and I(N1s) more preferably satisfy the relation $0.3 \leq I(P2s)/I(N1s) \leq 0.8$.

When in the XPS analysis performed, in the same manner as described above, for the outermost layer 15, with I(P2s) denoting the photoelectron detection intensity due to the 2S orbital electron of P to be detected and I(N1s) denoting the photoelectron detection intensity due to the 1S orbital electron of N to be detected, the relation $1 \leq I(P2s)/I(N1s) \leq 50$ is satisfied, sometimes the dynamic friction coefficient of the plating material comes to be small and the insertion force of terminals and connectors comes to be low. When the value of I(P2s)/I(N1s) is 1 or less, the insertion force comes to be slightly high, and when the value of I(P2s)/I(N1s) exceeds 50, the insertion force comes to be low, but sometimes the contact resistance at the early stage comes to be high and the solderability at the early stage is also degraded. In this case, I(P2s) and I(N1s) more preferably satisfy the relation $5 < I(P2s)/I(N1s) \leq 40$.

The concentration of the phosphoric acid ester(s) for obtaining the deposition amounts of the post-treatment solution components on the surface of the outermost layer 15 of the present invention is 0.1 to 10 g/L, and preferably 0.5 to 5 g/L. On the other hand, the concentration of the cyclic organic compound(s) is, in relation to the total volume of the treatment solution, 0.01 to 1.0 g/L and preferably 0.05 to 0.6 g/L.

The phosphoric acid ester-based solution is an aqueous solution having the above-described components, and when the solution is heated to increase the temperature of the solution to 40 to 80° C., the emulsification of the components into water proceed faster, and the drying of the materials after the treatment is facilitated.

The surface treatment may also be performed by applying the phosphoric acid ester-based solution to the surface of the outermost layer 15 after the formation of the outermost layer 15. Examples of the method for applying the solution concerned include: spray coating, flow coating, dip coating and roll coating; from the viewpoint of productivity, dip coating or spray coating is preferable. On the other hand, as another treatment method, the surface treatment with the phosphoric acid ester-based solution may also be performed by conducting an electrolysis by immersing the metallic material after the formation of the outermost layer 15 in the phosphoric acid ester-based solution and using as the anode the metallic material after the formation of the outermost layer 15. The metallic material subjected to the treatment based on this method offers an advantage that the contact resistance in a high temperature environment is more hardly increased.

The hitherto presented description of the surface treatment with the phosphoric acid ester-based solution may be performed either after the formation of the outermost layer 15 or after the reflow treatment subsequent to the formation of the outermost layer 15. The surface treatment is not particularly temporarily limited, but from industrial viewpoint, the surface treatment is preferably performed as a sequence of steps.

<Properties of Metallic Material for Electronic Components>

The indentation hardness of the surface of the outermost layer 15, namely, the hardness obtained by hitting a dent on the surface of the outermost layer 15 with a load of 10 mN on the basis of a nanoindentation hardness test is preferably 1000 MPa or more. The indentation hardness being 1000 MPa or more improves the thin film lubrication effect due to the hard outermost layer 15, and decreases the adhesive wear. The indentation hardness of the surface of the outermost layer 15 is preferably 10000 MPa or less. The indentation hardness of the surface of the outermost layer 15 being 10000 MPa improves the bending processability, makes cracks hardly occur in the molded portion when the metallic material for electronic components of the present invention is subjected to press molding, and consequently suppresses the degradation of the gas corrosion resistance.

The arithmetic mean height (Ra) of the surface of the outermost layer 15 is preferably 0.3 μm or less. The arithmetic mean height (Ra) of the surface of the outermost layer 15 being 0.3 μm or less reduces the raised portions of the surface relatively tending to be corroded, thus smoothes the surface and improves the gas corrosion resistance.

The maximum height (Rz) of the surface of the outermost layer 15 is preferably 3 μm or less. The maximum height (Rz) of the surface of the outermost layer 15 being 3 μm or less reduces the raised portions relatively tending to be corroded, thus smoothes the surface and improves the gas corrosion resistance.

The Vickers hardness of the cross section of the lower layer 12 is preferably Hv 300 or more. The Vickers hardness of the section of the lower layer 12 being Hv 300 or more makes the lower layer 12 harder and further improves the thin film lubrication effect to further decrease the adhesive wear. On the other hand, the Vickers hardness Hv 1000 of the cross section of the lower layer 12 is preferably Hv 1000 or less. The Vickers hardness of the cross section of the lower layer 12 being Hv 1000 or less improves the bending processability, makes cracks hardly occur in the molded portion when the metallic material for electronic components of the present invention is subjected to press molding, and consequently suppresses the degradation of the gas corrosion resistance.

The indentation hardness of the cross section of the lower layer 12 is preferably 1500 MPa or more. The indentation hardness of the cross section of the lower layer 12 being 1500 MPa or more makes the lower layer harder and further improves the thin film lubrication effect and decreases the adhesive wear. On the other hand, the indentation hardness of the cross section of the lower layer 12 is preferably 10000 MPa or less. The indentation hardness of the cross section of the lower layer 12 being 10000 MPa or less improves the bending processability, makes cracks hardly occur in the molded portion when the metallic material for electronic components of the present invention is subjected to press molding, and consequently suppresses the degradation of the gas corrosion resistance.

<Applications of Metallic Material for Electronic Components>

Examples of the application of the metallic material for electronic components of the present invention include, without being particularly limited to: a connector terminal using, in the contact portion thereof, the metallic material for electronic components, an FFC terminal or an FPC terminal using, in the contact portion thereof, the metallic material for electronic components, and an electronic component using, in the electrode thereof for external connection, the metallic material for electronic components. The terminal does not depend on the connection mode on the wiring side as exemplified by a crimp-type terminal, a soldering terminal and a press-fit terminal. Examples of the electrode for external connection include a connection component prepared by applying a surface treatment to a tab, and material surface treated for use in under bump metal of a semiconductor.

Connectors may also be prepared by using such connector terminals formed as described above, and an FFC or an FPC may also be prepared by using an FFC terminal or an FPC terminal.

The metallic material for electronic components of the present invention may also be used in a push-in type terminal for fixing a board connection portion to a board by pushing the board connection portion into the through hole formed in the board, wherein a female terminal connection portion and the board connection portion are provided respectively on one side and the other side of a mounting portion to be attached to a housing.

In a connector, both of the male terminal and the female terminal may be made of the metallic material for electronic components of the present invention, or only one of the male terminal and the female terminal may be made of the metallic material for electronic components of the present invention. The use of the metallic material for electronic components of the present invention for both of the male terminal and the female terminal further improves the low degree of insertion/extraction force.

<Method for Producing Metallic Material for Electronic Components>

As the method for producing the metallic material for electronic components of the present invention, for example, either a wet plating (electroplating or electroless plating) or a dry plating (sputtering or ion plating) can be used.

Examples

Hereinafter, Examples of the present invention, Reference Examples and Comparative Examples are presented together; these Examples and Comparative Examples are provided for better understanding of the present invention, and are not intended to limit the present invention.

As Examples, Reference Examples and Comparative Examples, under the conditions shown in Table 1, the surface treatment was performed in the sequence of electrolytic degreasing, acid cleaning, first plating, second plating, third plating and heat treatment.

(Materials)

(1) Plate: thickness: 0.30 mm, width: 30 mm, component: Cu-30Zn (2) Male terminal: thickness: 0.64 mm, width: 2.3 mm, component: Cu-30Zn (3) Push-in type terminal: Press-fit terminal PCB connector, R800, manufactured by Tokiwa & Co., Inc.

(First Plating Conditions)

(1) Semi-Glossy Ni Plating
Surface treatment method: Electroplating
Plating solution: Ni sulfamate plating solution+saccharin
Plating temperature: 55° C.
Electric current density: 0.5 to 4 A/dm$^2$ (2) Glossy Ni Plating
Surface treatment method: Electroplating
Plating solution: Ni sulfamate plating solution+saccharin+additives
Plating temperature: 55° C.
Electric current density: 0.5 to 4 A/dm$^2$ (3) Matte Ni Plating
Surface treatment method: Electroplating
Plating solution: Ni sulfamate plating solution
Plating temperature: 55° C.
Electric current density: 0.5 to 4 A/dm$^2$ (4) Ni-Plating
Surface treatment method: Electroplating
Plating solution: Ni sulfamate plating solution+phosphite
Plating temperature: 55° C.
Electric current density: 0.5 to 4 A/dm$^2$ (5) Cu Plating
Surface treatment method: Electroplating
Plating solution: Cu sulfate plating solution
Plating temperature: 30° C.
Electric current density: 0.5 to 4 A/dm$^2$ (Second Plating Conditions)

(1) Ag Plating
Surface treatment method: Electroplating
Plating solution: Ag cyanide plating solution
Plating temperature: 40° C.
Electric current density: 0.2 to 4 A/dm$^2$ (2) Sn Plating
Surface treatment method: Electroplating
Plating solution: Sn methanesulfonate plating solution
Plating temperature: 40° C.
Electric current density: 0.5 to 4 A/dm$^2$ (Third Plating Conditions)

(1) Sn Plating Conditions
Surface treatment method: Electroplating
Plating solution: Sn methanesulfonate plating solution
Plating temperature: 40° C.
Electric current density: 0.5 to 4 A/dm$^2$ (Heat Treatment)

The heat treatment was performed by placing the sample on a hot plate, and verifying that the surface of the hot plate reached the predetermined temperature.

(Post-Treatment)

Figure 2:
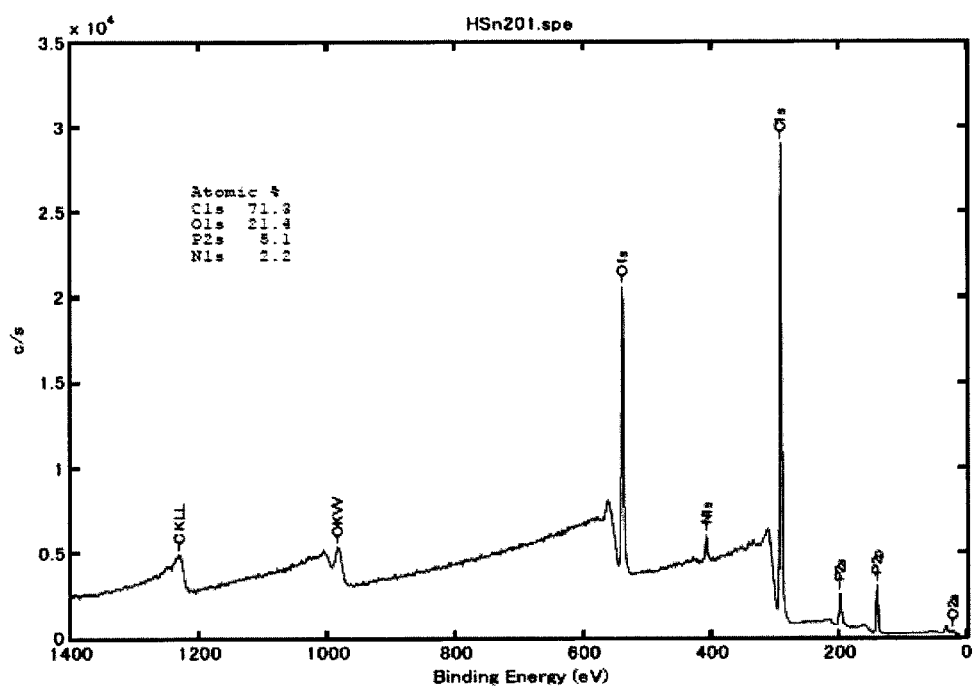
FIG. 2 is an XPS analysis chart of a metallic material for electronic components according to the present invention.
Figure 3:
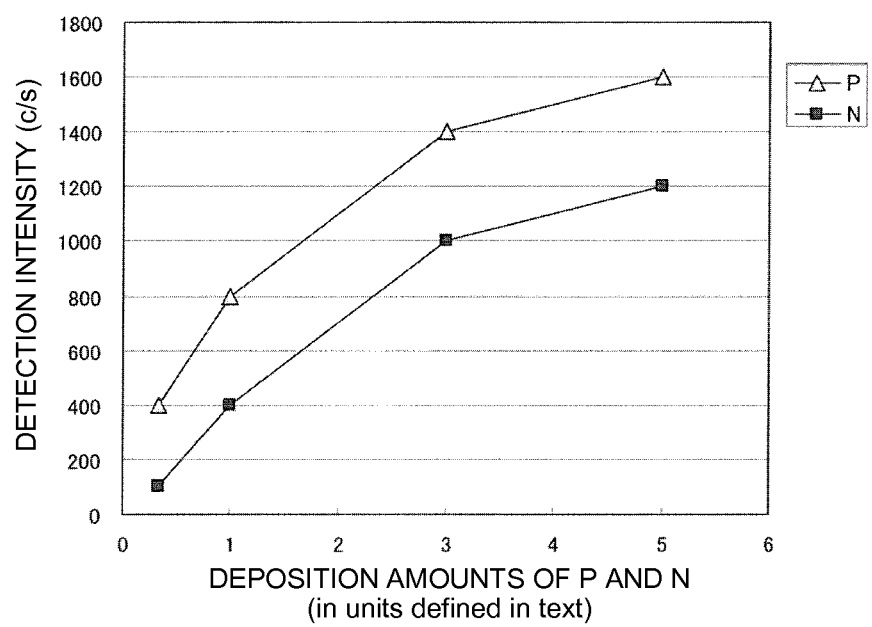
FIG. 3 is a graph showing the relation between the deposition amounts and the detection intensities of the components of the post treatment solution of a metallic material for electronic components according to the present invention.

For Examples 19 to 34, relative to Example 1, additionally a phosphoric acid ester-based solution was used as a surface treatment solution, application based on immersion or anode electrolysis (2 V, potentiostatic electrolysis) was performed, and thus the surface treatment of the plating surface was performed. The surface treatment conditions in this case are shown in Table 2 presented below. After these treatments, the samples were dried with warm air. For the determination of the amounts of P and N deposited on the plating surface, first by using several samples having known deposition amounts, a quantitative analysis based on XPS (X-ray photoelectron analysis method) was performed, and the detection intensities (number of counts detected in 1 second) of P(2s orbital) and N(1s orbital) were measured. Next, on the basis of the thus obtained results, the relations between the deposition amounts and the detection intensities were derived, and from these relations, the deposition amounts of P and N of unknown samples were determined. FIG. 2 shows an example of the XPS analysis results, and FIG. 3 shows the relations between the deposition amounts of the post-treatment solution components and the XPS detection intensities (the unit of the deposition amount of P=1.1×10$^{-9}$ mol/cm$^2$; the unit of the deposition amount of N=7.8×10$^{-11}$ mol/cm$^2$).

(Measurement of Thicknesses of Outermost Layer, Upper Layer and Intermediate Layer, and Determination of Composition and Structure of Upper Layer)

The measurement of the thicknesses of the outermost layer, the upper layer and the intermediate layer, and the determination of the composition of the upper layer of each of the obtained samples were performed by the line analysis based on the STEM (scanning transmission electron microscope) analysis. The analyzed elements are the elements in the compositions of the outermost layer, the upper layer, the intermediate layer and the lower layer, and C, S and O. These elements are defined as the specified elements. On the basis of the total concentration of the specified elements defined as 100%, the concentrations (at %) of the respective elements were analyzed. The thickness corresponds to the distance determined from the line analysis (or area analysis). As the STEM apparatus, the JEM-2100F manufactured by JEOL Ltd. was used. The acceleration voltage of this apparatus is 200 kV.

In the determination of the structure of the upper layer, the structure was determined by comparing the composition determined on the basis of STEM with the phase diagram.

In the measurement of the thicknesses of the outermost layer, the upper layer and the intermediate layer, and in the determination of the composition and the structure of the upper layer, the evaluations were performed for arbitrary 10 points and the resulting values were averaged.

(Measurement of Thickness of Lower Layer)

The thickness of the lower layer was measured with the X-ray fluorescent analysis thickness meter (SEA5100, collimator: 0.1 mmΦ, manufactured by Seiko Instruments Inc.).

In the determination of the measurement of the thickness of the lower layer, the evaluations were performed for arbitrary 10 points and the resulting values were averaged.

(Evaluations)

For each of the samples, the following evaluations were performed.

A. Adhesive Wear

The adhesive wear was evaluated by performing an insertion/extraction test for each of the plated male terminals according to Examples and Comparative Examples by using a commercially available Sn reflow plating female terminal (090 type Sumitomo TS/Yazaki 09011 Series female terminal, non-waterproofing/F090-SMTS).

The measurement apparatus used in the test was the 1311NR manufactured by Aikoh Engineering Co., Ltd., and the evaluation was performed with a sliding distance of a male pin of 5 mm. The number of the samples was set at five, and the adhesive wear was evaluated by using the insertion force. As the insertion force, the averaged value of the maximum values of the respective samples was adopted. As the blank material of the adhesive wear, the sample of Comparative Example 9 was adopted.

The intended target of the adhesive wear is less than 85% of the maximum insertion force of Comparative Example 9. This is because the insertion force of Comparative Example 10 was 90% of the maximum insertion force of Comparative Example 9, and a larger reduction of the insertion force than the reduction of the insertion force in Comparative Example 10 was adopted as the intended target.

B. Whiskers

Whiskers were evaluated by the load test (ball indenter method) of JEITA RC-5241. Specifically, each of the samples was subjected to the load test, and each of the samples subjected to the load test was observed with a SEM (model JSM-5410, manufactured by JEOL Ltd.) at a magnification of 100× to 10000×, and thus the occurrence state of the whiskers was observed. The load test conditions are shown below.

Diameter of ball indenter: Φ 1 mm±0.1 mm
Test load: 2 N±0.2 N
Test time: 120 hours
Number of samples: 10

The intended property is such that no whiskers 20 µm or more in length occurs, and the biggest intended target is such that no whiskers of any length occurs.

C. Contact Resistance

The contact resistance was measured with the contact simulator model CRS-113-Au manufactured by Yamasaki-seiki Co., Ltd., under the condition of the contact load of 50 kg, on the basis of the four-terminal method. The number of the samples was set at five, and the range from the minimum value to the maximum value of each of the samples was adopted. The intended target was the contact resistance of 10 mΩ or less.

D. Heat Resistance

The heat resistance was evaluated by measuring the contact resistance of a sample after an atmospheric heating (200° C.×1000 h). The intended property was the contact resistance of 10 mΩ or less, and the biggest target was such that the contact resistance was free from variation (equal) between before and after the heat resistance test.

E. Fine Sliding Wear Resistance

The fine sliding wear resistance was evaluated in terms of the relation between the number of the sliding operations and the contact resistance by using the fine sliding tester model CRS-G2050 manufactured by Yamasaki-seiki Co., Ltd., under the conditions of a sliding distance of 0.5 mm, a sliding speed of 1 mm/s, a contact load of 1 N, and a number of the back and forth sliding operations of 500. The number of the samples was set at five, and the range from the minimum value to the maximum value of each of the samples was adopted. The intended property was such that the contact resistance was 100 mΩ or less at the time of the number of sliding operations of 100.

F. Solder Wettability

The solder wettability was evaluated for the samples after plating. A solder checker (SAT-5000, manufactured by Rhesca Corp.) was used, a commercially available 25% rosin-methanol flux was used as a flux, and the solder wetting time was measured by a meniscograph method. A solder Sn-3Ag-0.5Cu (250° C.) was used. The number of the samples was set at five, and the range from the minimum value to the maximum value of each of the samples was adopted. The intended property was such that the zero cross time was 5 seconds (s) or less.

G. Gas Corrosion Resistance

The gas corrosion resistance was evaluated in the following test environment. The evaluation of the gas corrosion resistance was based on the exterior appearance of each of the samples after the completion of an environmental test. The intended property was such that the exterior appearance is hardly discolored or somewhat discolored to a degree practically causing no problem.

Hydrogen Sulfide Gas Corrosion Test
Hydrogen sulfide concentration: 10 ppm
Temperature: 40° C.
Humidity: 80% RH
Exposure time: 96 h
Number of samples: 5

H. Mechanical Durability

The mechanical durability was performed as follows. A push-in type terminal was pushed into a through hole (board thickness: 2 mm, through hole: Φ1 mm) and then extracted from the through hole, the cross section of the push-in type terminal was observed with a SEM (model JSM-5410, manufactured by JEOL Ltd.) at a magnification of 100× to 10000× and the occurrence state of powder was examined. The case where the diameter of the powder was less than 5 µm was marked with "circle", the case where the diameter of the powder was 5 µm or more and less than 10 µm was marked with "triangle", and the case where the diameter of the powder was 10 µm or more was marked with "X-mark".

I. Bending Processability

The bending processability was evaluated by using a W-shaped mold on the basis of the 90° bending under the condition that the ratio between the plate thickness of each of the samples and the bending radius was 1. The evaluation was performed as follows: the surface of the bending-processed portion of each of the samples was observed with an optical microscope, and the case where no cracks were observed and practically no problems were determined to be involved was marked with "circle", and the case where crack(s) was found was marked with "X-mark". The case where "circle" and "X-mark" were hardly distinguishable from each other was marked with "triangle".

J. Vickers Hardness

The Vickers hardness of the lower layer was measured by pressing an indenter from the cross section of the lower layer of each of the samples with a load of 980.7 mN (Hv 0.1) and a load retention time of 15 seconds.

K. Indentation Hardness

The indentation hardness of the upper layer was measured with a nanoindentation hardness tester (ENT-2100, manufactured by Elionix Inc.) by pressing an indenter onto the surface of each of the samples with a load of 10 mN.

The indentation hardness of the lower layer was measured by pressing an indenter from the cross section of the lower layer of each of the samples with a load of 10 mN (Hv 0.1) and a load retention time of 15 seconds.

L. Surface Roughness

The measurement of the surface roughness (the arithmetic mean height (Ra) and the maximum height (Rz)) was performed according to JIS B 0601, by using a noncontact three-dimensional measurement apparatus (model NH-3, manufactured by Mitaka Kohki Co., Ltd.). The cutoff was 0.25 mm, the measurement length was 1.50 mm, and the measurement was repeated five times for one sample.

Figure 4:
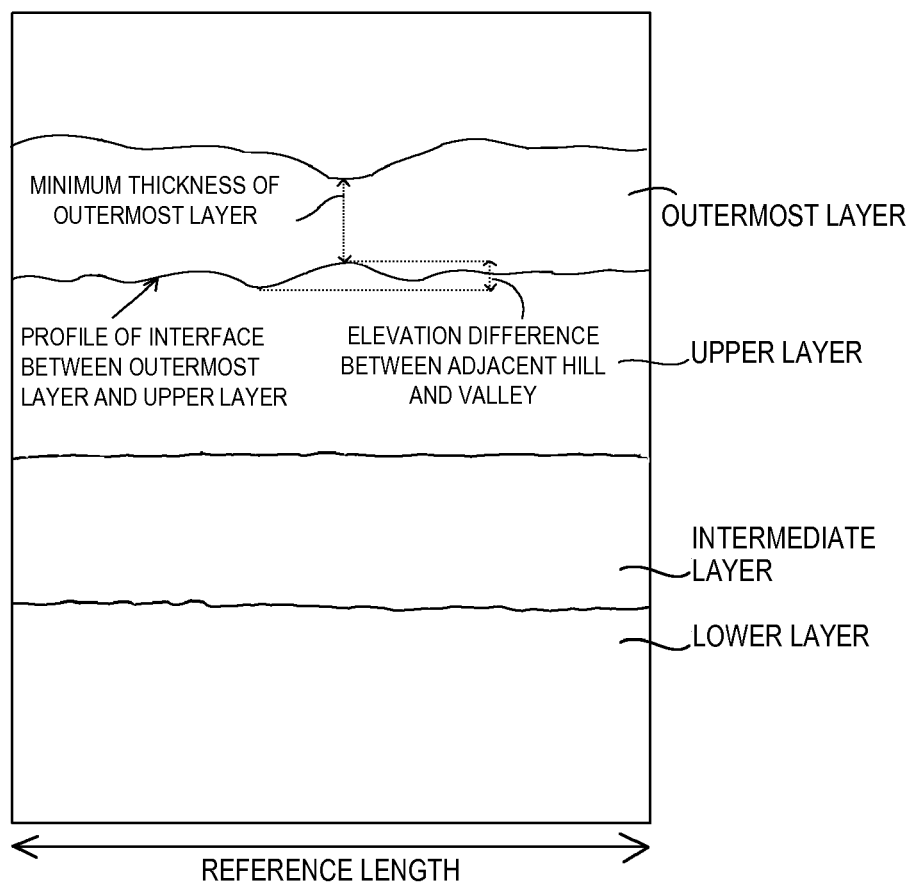
FIG. 4 is a schematic diagram of the HAADF (High-Angle-Annular-Dark-Filed)-STEM (scanning transmission electron microscope) image of a metallic material for electronic components according to the present invention.

M. Relation Between Thickness of Outermost Layer and Minimum Thickness of Outermost Layer The relation between the thickness of the outermost layer and the minimum thickness of the outermost layer was evaluated by using a HAADF (high-angle annular dark-field) image based on the STEM (scanning transmission electron microscope) analysis. FIG. 4 shows a schematic diagram of the HAADF (high-angle annular dark-field). The evaluation was performed as follows.

(1) In the evaluation, HAADF (high-angle annular dark-field) images at a magnification of 50 k were used, and the reference length of 3 µm/field of view was adopted.

(2) In the reference length of 3 µm/field of view, the minimum thickness site of the outermost layer was identified. When the minimum thickness site was hardly identified, the site concerned was identified with a magnification, if necessary, elevated to a higher level.

(3) In order to precisely determine the minimum thickness of the outermost layer, the identified site was observed with a higher magnification. By using HAADF (high-angle annular dark-field) images at a magnification of 100 to 200K, the "minimum thickness of the outermost layer" was precisely determined.

(4) The relation between the above-described "thickness (μm) of the outermost layer" determined by the line analysis based on the STEM (scanning transmission electron microscope) analysis and the "minimum thickness (μm) of the outermost layer" was grasped by measuring five fields of view per one sample.

FIG. 4 schematically depicts the surface roughness of each of the layers as exaggerated than actual observation so as for the above-described (1) to (4) to be easily understood.

N. Relation Between Thickness of Outermost Layer and Maximum Value of Elevation Differences Between Adjacent Hills and Valleys in Profile of Interface Between Outermost Layer and Upper Layer The relation between the thickness of the outermost layer and the maximum value of the elevation differences between the adjacent hills and valleys in the profile of the interface between the outermost layer and the upper layer was evaluated by using the HAADF (high-angle annular dark-field) image based on the STEM (scanning transmission electron microscope) analysis. FIG. 4 shows a schematic diagram of the HAADF (high-angle annular dark-field) image. The evaluation was performed as follows.

(1) In the evaluation, HAADF (high-angle annular dark-field) images at a magnification of 50 k were used, and the reference length of 3 μm/field of view was adopted.

(2) In the reference length of 3 μm/field of view, the maximum value site of the elevation differences between the adjacent hills and valleys in the profile of the interface between the outermost layer and the upper layer was identified. When the maximum value site of the elevation differences between the adjacent hills and valleys in the profile of the interface between the outermost layer and the upper layer was hardly identified, the site concerned was identified with a magnification, if necessary, elevated to a higher level.

(3) In order to precisely determine the maximum value site of the elevation differences between the adjacent hills and valleys in the profile of the interface between the outermost layer and the upper layer, the identified site was observed with a higher magnification. By using HAADF (high-angle annular dark-field) images at a magnification of 100 to 200K, the "maximum value of the elevation differences between the adjacent hills and valleys in the profile of the interface between the outermost layer and the upper layer" was precisely determined.

(4) The relation between the above-described "thickness (μm) of the outermost layer" determined by the line analysis based on the STEM (scanning transmission electron microscope) analysis and the "maximum value of the elevation differences between the adjacent hills and valleys in the profile of the interface between the outermost layer and the upper layer" was grasped by measuring five fields of view per one sample.

FIG. 4 schematically depicts the surface roughness of each of the layers as exaggerated than actual observation so as for the above-described (1) to (4) to be easily understood.

The test conditions and the test results are shown in Tables 1 to 7. In the tables presented below, the "composition" represents the ratio between the atomic concentrations (at %).

TABLE 1

|  |  | First plating conditions No. | Thickness [μm] | Second plating conditions No. | Thickness [μm] | Third plating conditions No. | Thickness [μm] | Heat treatment temperature [° C.] | Time [sec] | Atmosphere |
|---|---|---|---|---|---|---|---|---|---|---|
| Examples | 1 | 1 | 1 | 1 | 0.34 | 1 | 0.13 | 255 | 3 | The air |
|  | 2 | 1 | 0.07 | 1 | 0.34 | 1 | 0.13 | 255 | 3 | The air |
|  | 3 | 1 | 0.5 | 1 | 0.34 | 1 | 0.13 | 255 | 3 | The air |
|  | 4 | 1 | 0.3 | 1 | 0.34 | 1 | 0.13 | 255 | 3 | The air |
|  | 5 | 1 | 1 | 1 | 0.31 | 1 | 0.13 | 255 | 3 | The air |
|  | 6 | 1 | 1 | 1 | 0.49 | 1 | 0.13 | 255 | 3 | The air |
|  | 7 | 1 | 1 | 1 | 0.44 | 1 | 0.15 | 255 | 3 | The air |
|  | 8 | 1 | 1 | 1 | 0.156 | 1 | 0.084 | 255 | 3 | The air |
|  | 9 | 1 | 1 | 1 | 0.34 | 1 | 0.21 | 255 | 3 | The air |
|  | 10 | 1 | 1 | 1 | 0.355 | 1 | 0.115 | 255 | 3 | The air |
|  | 11 | 1 | 1 | 1 | 0.325 | 1 | 0.145 | 255 | 3 | The air |
|  | 12 | 1 | 1 | 1 | 0.22 | 1 | 0.25 | 255 | 3 | The air |
|  | 13 | 2 | 1 | 1 | 0.34 | 1 | 0.13 | 255 | 3 | The air |
|  | 14 | 3 | 1 | 1 | 0.34 | 1 | 0.13 | 255 | 3 | The air |
|  | 15 | 1 | 1 | 1 | 0.34 | 1 | 0.13 | 255 | 3 | The air |
|  | 16 | 1 | 1 | 1 | 0.34 | 1 | 0.13 | 255 | 3 | The air |
|  | 17 | 5 | 1 | 1 | 0.34 | 1 | 0.13 | 255 | 3 | The air |
|  | 18 | 1 | 1 | 1 | 0.19 | 1 | 0.04 | 255 | 3 | The air |
| Reference Examples | 1 | 1 | 1 | 1 | 0.11 | 1 | 0.09 | 255 | 3 | The air |
|  | 2 | 1 | 1 | 1 | 0.64 | 1 | 0.13 | 255 | 3 | The air |
|  | 3 | 1 | 1 | 1 | 0.124 | 1 | 0.036 | 255 | 3 | The air |
|  | 4 | 1 | 1 | 1 | 0.18 | 1 | 0.25 | 255 | 3 | The air |
|  | 5 | 1 | 1 | 1 | 0.34 | 1 | 0.31 | 255 | 3 | The air |
|  | 6 | 1 | 1 | 1 | 0.19 | 1 | 0.28 | 255 | 3 | The air |
|  | 7 | 4 | 1 | 1 | 0.34 | 1 | 0.13 | 255 | 3 | The air |
|  | 8 | 1 | 1 | 1 | 0.34 | 1 | 0.36 | 255 | 3 | The air |
|  | 9 | 1 | 1 | 1 | 0.19 | 1 | 0.04 | 255 | 3 | The air |
|  | 10 | 1 | 1 | 1 | 0.19 | 1 | 0.04 | 255 | 3 | The air |
| Comparative Examples | 1 | 1 | 0.03 | 1 | 0.34 | 1 | 0.13 | 255 | 3 | The air |
|  | 2 | 1 | 5.5 | 1 | 0.34 | 1 | 0.13 | 255 | 3 | The air |
|  | 3 | 1 | 1 | 1 | 0.045 | 1 | 0.06 | 255 | 3 | The air |

TABLE 1-continued

| | First plating conditions No. | Thickness [μm] | Second plating conditions No. | Thickness [μm] | Third plating conditions No. | Thickness [μm] | Heat treatment temperature [° C.] | Time [sec] | Atmosphere |
|---|---|---|---|---|---|---|---|---|---|
| 4 | 1 | 1 | 1 | 0.84 | 1 | 0.13 | 255 | 3 | The air |
| 5 | 1 | 1 | 1 | 0.695 | 1 | 0.135 | 255 | 3 | The air |
| 6 | 1 | 1 | 1 | 0.143 | 1 | 0.011 | 255 | 3 | The air |
| 7 | 1 | 1 | 1 | 0.34 | 1 | 0.46 | 255 | 3 | The air |
| 8 | 1 | 1 | 1 | 0.385 | 1 | 0.032 | 255 | 3 | The air |
| 9 | 1 | 1 | 2 | 1 | | | | | |
| 10 | 1 | 1 | 2 | 0.6 | | | | | |

TABLE 2

| | | Conditions of treatment with phosphoric acid ester-based solution | | | | |
|---|---|---|---|---|---|---|
| | No. | Phosphoric acid ester species | Cyclic organic compound species | Deposition amount of P mol/cm$^2$ | Deposition amount of N mol/cm$^2$ | Intensity ratio I(P2s)/I(N1s) between P and N detected by XPS |
| Examples | 19 | A1 | B1 | $1 \times 10^{-9}$ | $8 \times 10^{-11}$ | 1.13 |
| | 20 | A1 | B1 | $3 \times 10^{-9}$ | $9 \times 10^{-11}$ | 1.82 |
| | 21 | A2 | B1 | $2 \times 10^{-9}$ | $8 \times 10^{-11}$ | 1.40 |
| | 22 | A1 | B2 | $2 \times 10^{-9}$ | $9 \times 10^{-11}$ | 1.83 |
| | 23 | A1 | B3 | $2 \times 10^{-9}$ | $8 \times 10^{-11}$ | 1.29 |
| | 24 | A1 | B3 | $1 \times 10^{-12}$ | $8 \times 10^{-11}$ | 0.06 |
| | 25 | A1 | B1 | $1 \times 10^{-11}$ | $8 \times 10^{-11}$ | 0.13 |
| | 26 | A1 | B1 | $4 \times 10^{-8}$ | $8 \times 10^{-11}$ | 10.67 |
| | 27 | A1 | B1 | $7 \times 10^{-10}$ | $2 \times 10^{-12}$ | 1.62 |
| | 28 | A1 | B1 | $2 \times 10^{-9}$ | $8 \times 10^{-11}$ | 1.47 |
| | 29 | A1 | B1 | $2 \times 10^{-9}$ | $8 \times 10^{-11}$ | 1.47 |
| | 30 | A1 | B1 | $5 \times 10^{-12}$ | $8 \times 10^{-13}$ | 1.00 |
| | 31 | A1 | B1 | $8 \times 10^{-8}$ | $4 \times 10^{-8}$ | 3.49 |
| | 32 | A1 | B1 | $9 \times 10^{-7}$ | $8 \times 10^{-11}$ | 53.40 |
| | 33 | A1 | — | $2 \times 10^{-9}$ | — | ∞ |
| | 34 | — | B1 | — | $8 \times 10^{-11}$ | 0 |

* In relation to "Conditions of treatment with phosphoric acid ester-based solution," in Example 28, anode electrolysis was performed at 2 V for 5 seconds, and in Examples other than Example 28, immersion treatment was performed.
A1: Lauryl acidic phosphoric acid monoester (phosphoric acid monolauryl ester)
A2: Lauryl acidic phosphoric acid diester (phosphoric acid dilauryl ester)
B1: Benzotriazole
B2: Na salt of mercaptobenzothiazole
B3: Tolyltriazole

TABLE 3

| | | Outermost layer | | Upper layer | | | Thickness ratio between outermost layer and upper layer | Intermediate layer | |
|---|---|---|---|---|---|---|---|---|---|
| | | Composition | Thickness [μm] | Composition | Structure | Thickness [μm] | | Composition | Thickness [μm] |
| Examples | 1 | Sn | 0.07 | Ag:Sn = 8:2 | ζ-Phase + ε-phase | 0.30 | 2:8 | Ag | 0.10 |
| | 2 | Sn | 0.07 | Ag:Sn = 8:2 | ζ-Phase + ε-phase | 0.30 | 2:8 | Ag | 0.10 |
| | 3 | Sn | 0.07 | Ag:Sn = 8:2 | ζ-Phase + ε-phase | 0.30 | 2:8 | Ag | 0.10 |
| | 4 | Sn | 0.07 | Ag:Sn = 8:2 | ζ-Phase + ε-phase | 0.30 | 2:8 | Ag | 0.10 |
| | 5 | Sn | 0.07 | Ag:Sn = 8:2 | ζ-Phase + ε-phase | 0.30 | 2:8 | Ag | 0.07 |
| | 6 | Sn | 0.07 | Ag:Sn = 8:2 | ζ-Phase + ε-phase | 0.30 | 2:8 | Ag | 0.25 |
| | 7 | Sn | 0.07 | Ag:Sn = 8:2 | ζ-Phase + ε-phase | 0.40 | 15:85 | Ag | 0.10 |
| | 8 | Sn | 0.07 | Ag:Sn = 8:2 | ζ-Phase + ε-phase | 0.07 | 1:1 | Ag | 0.10 |
| | 9 | Sn | 0.15 | Ag:Sn = 8:2 | ζ-Phase + ε-phase | 0.30 | 1:2 | Ag | 0.10 |
| | 10 | Sn | 0.07 | Ag:Sn = 85:15 | ζ-Phase | 0.30 | 2:8 | Ag | 0.10 |
| | 11 | Sn | 0.07 | Ag:Sn = 3:1 | ε-Phase | 0.30 | 2:8 | Ag | 0.10 |
| | 12 | Sn | 0.07 | Ag:Sn = 4:6 | ε-Phase + β-Sn phase | 0.30 | 2:8 | Ag | 0.10 |
| | 13 | Sn | 0.07 | Ag:Sn = 8:2 | ζ-Phase + ε-phase | 0.30 | 2:8 | Ag | 010 |
| | 14 | Sn | 0.07 | Ag:Sn = 8:2 | ζ-Phase + ε-phase | 0.30 | 2:8 | Ag | 0.10 |
| | 15 | Sn | 0.07 | Ag:Sn = 8:2 | ζ-Phase + ε-phase | 0.30 | 2:8 | Ag | 0.10 |

TABLE 3-continued

|  |  | Outermost layer | | Upper layer | | | Thickness ratio between outermost layer and upper layer | Intermediate layer | |
|---|---|---|---|---|---|---|---|---|---|
|  |  | Composition | Thickness [μm] | Composition | Structure | Thickness [μm] | | Composition | Thickness [μm] |
|  | 16 | Sn | 0.07 | Ag:Sn = 8:2 | ζ-Phase + ε-phase | 0.30 | 2:8 | Ag | 0.10 |
|  | 17 | Sn | 0.07 | Ag:Sn = 8:2 | ζ-Phase + ε-phase | 0.30 | 2:8 | Ag | 0.10 |
|  | 18 | Sn | 0.02 | Ag:Sn = 85:15 | ζ-Phase | 0.10 | 17:83 | Ag | 0.10 |
| Reference Examples | 1 | Sn | 0.07 | Ag:Sn = 8:2 | ζ-Phase + ε-phase | 0.10 | 2:8 | Ag | 0.03 |
|  | 2 | Sn | 0.07 | Ag:Sn = 8:2 | ζ-Phase + ε-phase | 0.30 | 2:8 | Ag | 0.40 |
|  | 3 | Sn | 0.03 | Ag:Sn = 8:2 | ζ-Phase + ε-phase | 0.03 | 1:1 | Ag | 0.10 |
|  | 4 | Sn | 0.23 | Ag:Sn = 8:2 | ζ-Phase + ε-phase | 0.10 | 7:3 | Ag | 0.10 |
|  | 5 | Sn | 0.25 | Ag:Sn = 8:2 | ζ-Phase + ε-phase | 0.30 | 45:55 | Ag | 0.10 |
|  | 6 | Sn | 0.07 | Ag:Sn = 3:7 | ε-Phase + β-Sn phase | 0.30 | 2:8 | Ag | 0.10 |
|  | 7 | Sn | 0.07 | Ag:Sn = 8:2 | ζ-Phase + ε-phase | 0.30 | 2:8 | Ag | 0.10 |
|  | 8 | Sn | 0.01 | Ag:Sn = 8:2 | ζ-Phase + ε-phase | 0.30 | 3:97 | Ag | 0.10 |
|  | 9 | Sn | 0.02 | Ag:Sn = 85:15 | ζ-Phase | 0.10 | 17:83 | Ag | 0.10 |
|  | 10 | Sn | 0.02 | Ag:Sn = 85:15 | ζ-Phase | 0.10 | 17:83 | Ag | 0.10 |
| Comparative Examples | 1 | Sn | 0.07 | Ag:Sn = 8:2 | ζ-Phase + ε-phase | 0.30 | 2:8 | Ag | 0.10 |
|  | 2 | Sn | 0.07 | Ag:Sn = 8:2 | ζ-Phase + ε-phase | 0.30 | 2:8 | Ag | 0.10 |
|  | 3 | Sn | 0.05 | Ag:Sn = 8:2 | ζ-Phase + ε-phase | 0.05 | 1:1 | Ag | 0.005 |
|  | 4 | Sn | 0.07 | Ag:Sn = 8:2 | ζ-Phase + ε-phase | 0.30 | 2:8 | Ag | 0.60 |
|  | 5 | Sn | 0.03 | Ag:Sn = 85:15 | ζ-Phase | 0.70 | 4:96 | Ag | 0.10 |
|  | 6 | Sn | 0.003 | Ag:Sn = 85:15 | ζ-Phase | 0.05 | 6:94 | Ag | 0.10 |
|  | 7 | Sn | 0.40 | Ag:Sn = 8:2 | ζ-Phase + ε-phase | 0.30 | 57:43 | Ag | 0.10 |
|  | 8 | Sn | 0.03 | Ag:Sn = 95:5 | α-Ag phase | 0.30 | 2:8 | Ag | 0.10 |
|  | 9 | Sn | 1 |  |  |  |  |  |  |
|  | 10 | Sn | 0.6 |  |  |  |  |  |  |
| Intended target |  |  | 0.005 or more and less than 0.30 |  |  |  | Less than 0.50 |  | 0.01 or more and less than 0.50 |

TABLE 4

|  |  | Lower layer | | Outermost layer | | | Lower layer | | Whiskers | |
|---|---|---|---|---|---|---|---|---|---|---|
|  |  |  |  | Nanoindentation | Surface roughness | | Vickers | Nanoindentation | Number of whiskers less than 20 μm in length [pieces] | Number of whiskers of 20 μm or more in length [pieces] |
|  |  | Composition | Thickness [μm] | hardness [MPa] | Ra [μm] | Rz [μm] | hardness Hv | hardness [MPa] | | |
| Examples | 1 | Ni (semi-glossy) | 1.0 | 3500 | 0.24 | 2.35 | 300 | 3400 | 0 | 0 |
|  | 2 | Ni (semi-glossy) | 0.07 | — | — | — | — | — | 0 | 0 |
|  | 3 | Ni (semi-glossy) | 0.5 | — | — | — | — | — | 0 | 0 |
|  | 4 | Ni (semi-glossy) | 3 | — | — | — | — | — | 0 | 0 |
|  | 5 | Ni (semi-glossy) | 1.0 | — | — | — | — | — | 0 | 0 |
|  | 6 | Ni (semi-glossy) | 1.0 | — | — | — | — | — | 0 | 0 |
|  | 7 | Ni (semi-glossy) | 1.0 | — | — | — | — | — | 0 | 0 |
|  | 8 | Ni (semi-glossy) | 1.0 | — | — | — | — | — | 0 | 0 |
|  | 9 | Ni (semi-glossy) | 1.0 | — | — | — | — | — | 0 | 0 |
|  | 10 | Ni (semi-glossy) | 1.0 | — | — | — | — | — | 0 | 0 |
|  | 11 | Ni (semi-glossy) | 1.0 | — | — | — | — | — | 0 | 0 |
|  | 12 | Ni (semi-glossy) | 1.0 | — | — | — | — | — | 0 | 0 |
|  | 13 | Ni (glossy) | 1 | 6500 | — | — | 600 | 6700 | 0 | 0 |
|  | 14 | Ni (matte) | 1 | 700 | — | — | 130 | 1300 | 0 | 0 |
|  | 15 | Ni (semi-glossy) | 1.0 | — | 0.19 | 1.8 | — | — | 0 | 0 |
|  | 16 | Ni (semi-glossy) | 1.0 | — | 0.13 | 1.3 | — | — | 0 | 0 |
|  | 17 | Cu | 1 | — | — | — | — | — | 0 | 0 |
|  | 18 | Ni (semi-glossy) | 1 | — | — | — | — | — | 0 | 0 |
| Reference Examples | 1 | Ni (semi-glossy) | 1.0 | — | — | — | — | — | 0 | 0 |
|  | 2 | Ni (semi-glossy) | 1.0 | — | — | — | — | — | 0 | 0 |
|  | 3 | Ni (semi-glossy) | 1.0 | — | — | — | — | — | 0 | 0 |
|  | 4 | Ni (semi-glossy) | 1.0 | — | — | — | — | — | ≤1 | 0 |
|  | 5 | Ni (semi-glossy) | 1.0 | — | — | — | — | — | ≤1 | 0 |
|  | 6 | Ni (semi-glossy) | 1.0 | — | — | — | — | — | ≤1 | 0 |
|  | 7 | Ni:P = 98:2 | 1 | 10500 | — | — | 1200 | 12000 | 0 | 0 |
|  | 8 | Ni (semi-glossy) | 1.0 | — | — | — | — | — | 0 | 0 |
|  | 9 | Ni (semi-glossy) | 1 | — | — | — | — | — | 0 | 0 |
|  | 10 | Ni (semi-glossy) | 1 | — | — | — | — | — | 0 | 0 |

TABLE 4-continued

|  |  | Lower layer | | Outermost layer | | | | Lower layer | Whiskers | |
|---|---|---|---|---|---|---|---|---|---|---|
|  |  | Composition | Thickness [μm] | Nanoindentation hardness [MPa] | Surface roughness Ra [μm] | Surface roughness Rz [μm] | Vickers hardness Hv | Nanoindentation hardness [MPa] | Number of whiskers less than 20 μm in length [pieces] | Number of whiskers of 20 μm or more in length [pieces] |
| Comparative Examples | 1 | Ni (semi-glossy) | 0.03 | — | — | — | — | — | — | — |
|  | 2 | Ni (semi-glossy) | 5.5 | — | — | — | — | — | — | — |
|  | 3 | Ni (semi-glossy) | 1.0 | — | — | — | — | — | — | — |
|  | 4 | Ni (semi-glossy) | 1.0 | — | — | — | — | — | — | — |
|  | 5 | Ni (semi-glossy) | 1.0 | — | — | — | — | — | — | — |
|  | 6 | Ni (semi-glossy) | 1.0 | — | — | — | — | — | — | — |
|  | 7 | Ni (semi-glossy) | 1.0 | — | — | — | — | — | — | ≤1 |
|  | 8 | Ni (semi-glossy) | 1.0 | — | — | — | — | — | — | — |
|  | 9 | Ni (semi-glossy) | 1 | — | — | — | — | — | — | ≤3 |
|  | 10 | Ni (semi-glossy) | 1 | — | — | — | — | — | — | ≤2 |
| Intended target |  |  | 0.05 or more and less than 5.00 |  |  |  |  |  |  | 0 |

TABLE 5

|  |  | Adhesive wear Insertion force Maximum insertion force/maximum insertion force of Comparative Example 9 [%] | Contact resistance [mΩ] | Heat resistance Contact resistance [mΩ] | Fine sliding wear resistance Contact resistance [mΩ] | Solder wettability Zero cross time [sec] | Gas corrosion resistance Hydrogen sulfide Exterior appearance after test | Mechanical durability | Bending processability |
|---|---|---|---|---|---|---|---|---|---|
| Examples | 1 | Less than 80 | 1 to 3 | 1 to 3 | 10 to 50 | 2 to 4 | Not discolored | ○ | ○ |
|  | 2 | Less than 80 | 1 to 3 | 1 to 3 | 10 to 50 | 2 to 4 | Not discolored | ○ | ○ |
|  | 3 | Less than 80 | 1 to 3 | 1 to 3 | 10 to 50 | 2 to 4 | Not discolored | ○ | ○ |
|  | 4 | Less than 80 | 1 to 3 | 1 to 3 | 10 to 50 | 2 to 4 | Not discolored | ○ | ○ |
|  | 5 | Less than 80 | 1 to 3 | 1 to 3 | 10 to 50 | 2 to 4 | Not discolored | ○ | ○ |
|  | 6 | Less than 80 | 1 to 3 | 1 to 3 | 10 to 50 | 2 to 4 | Not discolored | ○ | ○ |
|  | 7 | Less than 80 | 1 to 3 | 1 to 3 | 10 to 50 | 2 to 4 | Not discolored | ○ | ○ |
|  | 8 | Less than 80 | 1 to 3 | 1 to 3 | 10 to 50 | 2 to 4 | Not discolored | ○ | ○ |
|  | 9 | Less than 80 | 1 to 3 | 1 to 3 | 10 to 50 | 2 to 4 | Not discolored | ○ | ○ |
|  | 10 | Less than 80 | 1 to 3 | 1 to 3 | 10 to 50 | 2 to 4 | Not discolored | ○ | ○ |
|  | 11 | Less than 80 | 1 to 3 | 1 to 3 | 10 to 50 | 2 to 4 | Not discolored | ○ | ○ |
|  | 12 | Less than 80 | 1 to 3 | 1 to 3 | 10 to 50 | 2 to 4 | Not discolored | ○ | ○ |
|  | 13 | Less than 80 | 1 to 3 | 1 to 3 | 10 to 50 | 1 to 3 | Not discolored | ○ | ○ |
|  | 14 | Less than 80 | 1 to 3 | 2 to 4 | 10 to 50 | 2 to 4 | Not discolored | ○ | ○ |
|  | 15 | Less than 80 | 1 to 3 | 1 to 3 | 10 to 50 | 2 to 4 | Not discolored | ○ | ○ |
|  | 16 | Less than 80 | 1 to 3 | 1 to 3 | 10 to 50 | 1 to 3 | Not discolored | ○ | ○ |
|  | 17 | Less than 80 | 1 to 3 | 1 to 3 | 10 to 50 | 2 to 4 | Not discolored | ○ | ○ |
|  | 18 | Less than 80 | 1 to 3 | 1 to 3 | 10 to 50 | 1 to 3 | Not discolored | ○ | ○ |
| Reference Examples | 1 | Less than 80 | 1 to 3 | 3 to 5 | 30 to 100 | 3 to 5 | Not discolored | ○ | ○ |
|  | 2 | 80 or more and less than 85 | 1 to 3 | 2 to 4 | 10 to 50 | 2 to 4 | Not discolored | Δ | ○ |
|  | 3 | Less than 80 | 1 to 3 | 2 to 4 | 10 to 50 | 2 to 4 | Somewhat discolored | ○ | ○ |
|  | 4 | 80 or more and less than 85 | 1 to 3 | 2 to 4 | 30 to 100 | 2 to 4 | Not discolored | ○ | ○ |
|  | 5 | 80 or more and less than 85 | 1 to 3 | 2 to 4 | 30 to 100 | 2 to 4 | Not discolored | ○ | ○ |
|  | 6 | 80 or more and less than 85 | 1 to 3 | 2 to 4 | 30 to 100 | 2 to 4 | Not discolored | ○ | ○ |
|  | 7 | Less than 80 | 1 to 3 | 2 to 4 | 10 to 50 | 2 to 4 | Not discolored | ○ | Δ |
|  | 8 | Less than 80 | 1 to 3 | 2 to 4 | 10 to 50 | 2 to 4 | Somewhat discolored | ○ | ○ |
|  | 9 | Less than 80 | 1 to 3 | 2 to 4 | 10 to 50 | 2 to 4 | Somewhat discolored | ○ | ○ |
|  | 10 | Less than 80 | 1 to 3 | 2 to 4 | 10 to 50 | 2 to 4 | Somewhat discolored | ○ | ○ |
| Comparative Examples | 1 | 85 or more | — | 10< | — | 5< | — | — | — |
|  | 2 | — | — | — | — | — | — | — | X |
|  | 3 | — | — | 10< | 100< | 5< | Discolored | — | — |
|  | 4 | 85 or more | — | — | — | — | — | X | — |
|  | 5 | 85 or more | — | — | — | — | Discolored | X | — |
|  | 6 | — | — | — | — | — | Discolored | — | — |

TABLE 5-continued

| | | Adhesive wear Insertion force Maximum insertion force/maximum insertion force of Comparative Example 9 [%] | Contact resistance [mΩ] | Heat resistance Contact resistance [mΩ] | Fine sliding wear resistance Contact resistance [mΩ] | Solder wettability Zero cross time [sec] | Gas corrosion resistance Hydrogen sulfide Exterior appearance after test | Mechanical durability | Bending processability |
|---|---|---|---|---|---|---|---|---|---|
| | 7 | 85 or more | — | — | 100< | — | — | — | — |
| | 8 | — | — | — | — | — | Discolored | — | — |
| | 9 | 100 | — | — | 100< | — | — | — | — |
| | 10 | 90 | — | — | 100< | — | — | — | — |
| Intended target | | less than 85 | 10 or less | 10 or less | 100 or less | 5 or less | Not discolored Somewhat discolored (discoloration practically causing no problem) | ○ | |

TABLE 6

| | | Outermost layer | | Upper layer | | | Thickness ratio between outermost layer and upper layer | Intermediate layer | | Lower layer | |
|---|---|---|---|---|---|---|---|---|---|---|---|
| | | Composition | Thickness [μm] | Composition | Structure | Thickness [μm] | | Composition | Thickness [μm] | Composition | Thickness [μm] |
| Example | 18 | Sn Plating at 1 A/dm² | 0.02 | Ag:Sn = 85:15 Plating at 1 A/dm² | ζ-Phase | 0.10 | 17:83 | Ag | 0.10 | Ni (semi-glossy) | 1 |
| Reference Example | 9 | Sn Plating at 4 A/dm² | 0.02 | Ag:Sn = 85:15 Plating at 1 A/dm² | ζ-Phase | 0.10 | 17:83 | Ag | 0.10 | Ni (semi-glossy) | 1 |
| | 10 | Sn Plating at | 0.02 | Ag:Sn = 85:15 Plating at 1 A/dm² | ζ-Phase | 0.10 | 17:83 4 A/dm² | Ag | 0.10 | Ni (semi-glossy) | 1 |

| | | Minimum thickness of outermost layer [μm] | Relation between thickness of outermost layer and minimum thickness of outermost layer | Maximum value of elevation differences between adjacent hills and valleys in profile of interface between outermost layer and upper layer [μm] | Relation between thickness of outermost layer and maximum value of elevation differences between adjacent hills and valleys in profile of interface between outermost layer and upper layer | Gas corrosion resistance Hydrogen sulfide Exterior appearance after test |
|---|---|---|---|---|---|---|
| Example | 18 | 0.015 | Minimum thickness of outermost layer ≥ thickness of outermost layer × 0.5 | 0.009 | Maximum value of elevation differences between adjacent hills and valleys in profile of interface between outermost layer and upper layer ≤ thickness of outermost layer × 0.5 | Not discolored |
| Reference Example | 9 | 0.008 | Minimum thickness of outermost layer < thickness of outermost layer × 0.5 | 0.007 | Maximum value of elevation differences between adjacent hills and valleys in profile of interface between outermost layer and upper layer ≤ thickness of outermost layer × 0.5 | Somewhat discolored |

TABLE 6-continued

| | | | | | |
|---|---|---|---|---|---|
| 10 | 0.012 | Minimum thickness of outermost layer ≥ thickness of outermost layer × 0.5 | 0.030 | Maximum value of elevation differences between adjacent hills and valleys in profile of interface between outermost layer and upper layer > thickness of outermost layer × 0.5 | Somewhat discolored |

TABLE 7

| | | Whiskers | | Adhesive wear Insertion force Maximum insertion force/maximum insertion force of Comparative Example 9 [%] | Contact resistance [mΩ] | Heat resistance Contact resistance [mΩ] | Fine sliding wear resistance Contact resistance [mΩ] | Solder wettability Zero cross time [sec] | Gas corrosion resistance Hydrogen sulfide Exterior appearance after test | Mechanical durability | Bending processability |
|---|---|---|---|---|---|---|---|---|---|---|---|
| | | Number of whiskers less than 20 μm in length [pieces] | Number of whiskers of 20 μm or more in length [pieces] | | | | | | | | |
| Examples | 19 | 0 | 0 | Less than 80 | 1 to 2 | 1 to 2 | 10 to 30 | 0.5 to 2 | Not discolored | ○ | ○ |
| | 20 | 0 | 0 | Less than 80 | 1 to 2 | 1 to 2 | 10 to 30 | 0.5 to 2 | Not discolored | ○ | ○ |
| | 21 | 0 | 0 | Less than 80 | 1 to 2 | 1 to 2 | 10 to 30 | 0.5 to 2 | Not discolored | ○ | ○ |
| | 22 | 0 | 0 | Less than 80 | 1 to 2 | 1 to 2 | 10 to 30 | 0.5 to 2 | Not discolored | ○ | ○ |
| | 23 | 0 | 0 | Less than 80 | 1 to 2 | 1 to 2 | 10 to 30 | 0.5 to 2 | Not discolored | ○ | ○ |
| | 24 | 0 | 0 | Less than 80 | 1 to 2 | 1 to 2 | 10 to 30 | 0.5 to 2 | Not discolored | ○ | ○ |
| | 25 | 0 | 0 | Less than 80 | 1 to 2 | 1 to 2 | 10 to 30 | 0.5 to 2 | Not discolored | ○ | ○ |
| | 26 | 0 | 0 | Less than 80 | 1 to 2 | 1 to 2 | 10 to 30 | 0.5 to 2 | Not discolored | ○ | ○ |
| | 27 | 0 | 0 | Less than 80 | 1 to 2 | 1 to 2 | 10 to 30 | 0.5 to 2 | Not discolored | ○ | ○ |
| | 28 | 0 | 0 | Less than 80 | 1 to 2 | 1 to 2 | 10 to 30 | 0.5 to 2 | Not discolored | ○ | ○ |
| | 29 | 0 | 0 | Less than 80 | 1 to 2 | 1 to 2 | 10 to 30 | 0.5 to 2 | Not discolored | ○ | ○ |
| | 30 | 0 | 0 | Less than 80 | 1 to 2 | 1 to 2 | 10 to 30 | 0.5 to 2 | Not discolored | ○ | ○ |
| | 31 | 0 | 0 | Less than 80 | 1 to 2 | 1 to 2 | 10 to 30 | 0.5 to 2 | Not discolored | ○ | ○ |
| | 32 | 0 | 0 | Less than 80 | 1 to 2 | 1 to 2 | 10 to 30 | 0.5 to 2 | Not discolored | ○ | ○ |
| | 33 | 0 | 0 | Less than 80 | 1 to 2 | 1 to 3 | 10 to 40 | 1 to 3 | Not discolored | ○ | ○ |
| | 34 | 0 | 0 | Less than 80 | 1 to 3 | 1 to 3 | 10 to 50 | 2 to 4 | Not discolored | ○ | ○ |
| Intended target | | | 0 | Less than 85 | 10 or less | 10 or less | 100 or less | 5 or less | Not discolored | ○ | ○ |

Examples 1 to 34 were each a metallic material for electronic components excellent in any of the low degree of whisker formation, the low adhesive wear property and the high durability.

In Reference Example 1, the thickness of the intermediate layer was 0.03 μm to be somewhat thin, and hence the heat resistance, the fine sliding wear resistance and the solder wettability were poorer than those of Examples although the intended properties were obtained.

In Reference Example 2, the thickness of the intermediate layer was 0.4 μm to be somewhat thick, and hence the adhesive wear property and the mechanical durability were poorer than those of Examples although the intended properties were obtained.

In Reference Example 3, the thickness of the upper layer was 0.03 μm to be somewhat thin, and hence the gas corrosion resistance was poorer than those of Examples although the intended properties were obtained.

In Reference Example 4, the ratio of outermost layer: upper layer was 7:3 for the proportion of the outermost layer to be somewhat larger, and hence the whiskers less than 20 μm in length occurred, and the adhesive wear property and the fine sliding wear resistance were poorer than those of Examples although the intended properties were obtained.

In Reference Example 5, the thickness of the outermost layer was 0.25 μm to be somewhat thick, and hence the whiskers less than 20 μm in length occurred, and the adhesive wear property and the fine sliding wear resistance were poorer than those of Examples although the intended properties were obtained.

In Reference Example 6, the ratio of Ag:Sn in the upper layer was 3:7 for the proportion of Sn to be somewhat larger, and hence the whiskers less than 20 μm in length occurred, and the adhesive wear property and the fine sliding wear resistance were poorer than those of Examples although the intended properties were obtained.

In Reference Example 7, the nanoindentation hardness of the outermost layer was 10500 MPa to be somewhat large in value, and hence the bending processability was poorer than those of Examples although the intended properties were obtained.

In Reference Example 8, the thickness of the upper layer was 0.01 μm to be somewhat thin, and hence the gas corrosion resistance was poorer than those of Examples.

In Reference Example 9, the minimum thickness of the outermost layer was less than 50% of the thickness of the outermost layer and the gas corrosion resistance was poorer than those of Examples although the intended properties were obtained.

In Reference Example 10, the maximum value of the elevation differences between the adjacent hills and valleys in the profile of the interface between the outermost layer and the upper layer exceeds 50% of the thickness of the outermost layer, and hence the gas corrosion resistance was poorer than those of Examples although the intended properties were obtained.

In Comparative Example 1, the thickness of the lower layer was 0.03 µm to be thinner than the intended target, and hence the adhesive wear property, the heat resistance and the solder wettability were poor.

In Comparative Example 2, the thickness of the lower layer was 5.5 µm to be thicker than the intended target, and hence the bending processability was poor.

In Comparative Example 3, the thickness of the intermediate layer was 0.005 µm to be thinner than the intended target, and hence the heat resistance, the fine sliding wear resistance, the solder wettability and the gas corrosion resistance were poor.

In Comparative Example 4, the thickness of the intermediate layer was 0.6 µm to be thicker than the intended target, and hence the adhesive wear property and the mechanical durability were poor.

In Comparative Example 5, the thickness of the upper layer was 0.7 µm to be thicker than the intended target, and hence the adhesive wear property and the mechanical durability were poor. The ratio of outermost layer:upper layer was 9:91 for the proportion of the outermost layer to be thinner than the intended target, and hence the gas corrosion resistance was poor.

In Comparative Example 6, the thickness of the outermost layer was 0.003 µm to be thinner than the intended target, and hence the gas corrosion resistance was poor.

In Comparative Example 7, the thickness of the outermost layer was 0.40 µm to be thicker than the intended target, and hence the whiskers less than 20 µm in length occurred, and the heat resistance and the fine sliding wear resistance were poor.

In Comparative Example 8, the ratio of Ag:Sn in the upper layer gave the proportion of Ag of 90% or more and thus the proportion of Ag was high, and hence the gas corrosion resistance was poor.

Figure 5:
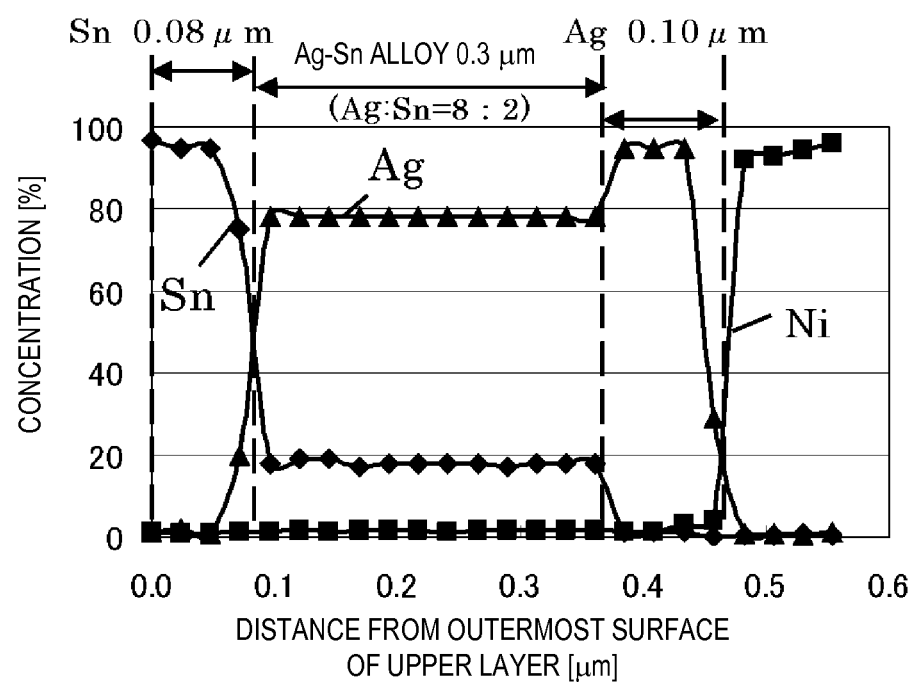
FIG. 5 is a schematic diagram of the STEM (scanning transmission electron microscope) line analysis results of a metallic material for electronic components according to the present invention.
Figure 6:
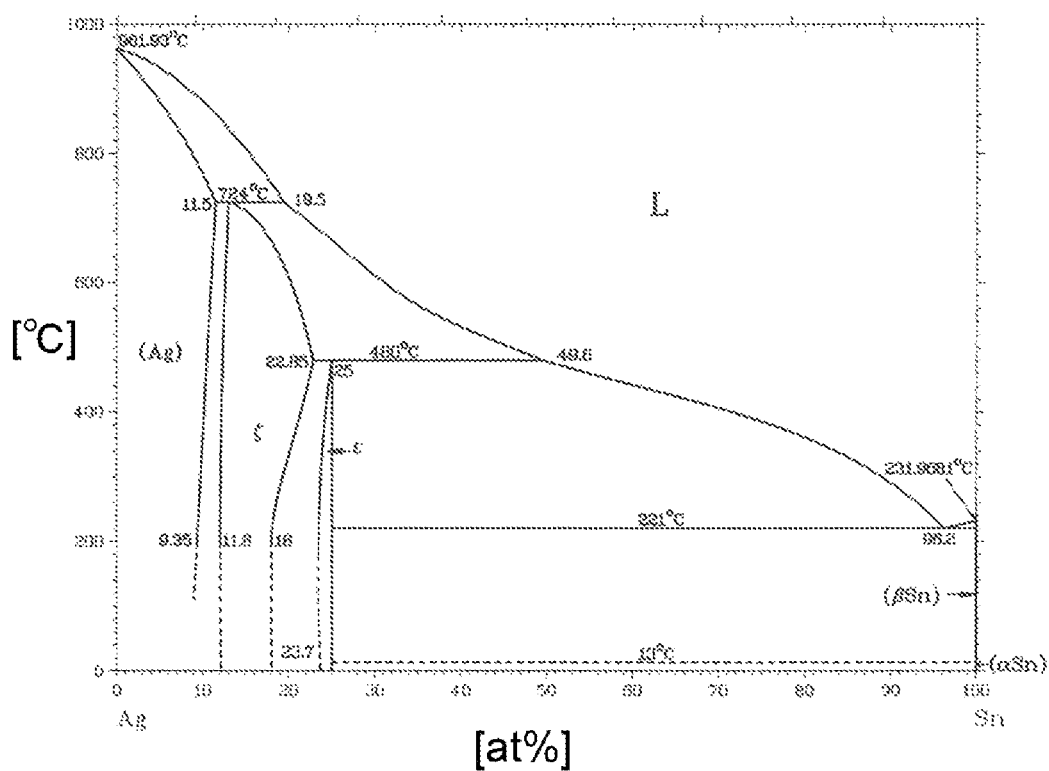
FIG. 6 is the phase diagram of Sn—Ag.

Comparative Examples 9 and 10 are blank materials. FIG. 5 shows a schematic diagram of the results of the line analysis of the metallic material for electronic components according to an embodiment of the present invention with a STEM (scanning transmission electron microscope). In the case of FIG. 5, it is said that sequentially from the outermost surface, the outermost layer is formed of Sn and is present in a thickness of 0.08 µm, the upper layer is formed of an Ag—Sn alloy and is present in a thickness of 0.30 µm, and the intermediate layer is formed of Ag and is present in a thickness of 0.10 µm. Moreover, it is also said that the composition (at %) of the Ag—Sn alloy in the upper layer is such that Ag:Sn=8:2. By comparing the ratio of Ag:Sn=8:2 with the Ag—Sn phase diagram of FIG. 6, it is said that the ζ-phase (Sn: 11.8 to 22.9%) and the ε-phase ($Ag_3Sn$) of the Sn—Ag alloy are present.

REFERENCE SIGNS LIST

10 Metallic material for electronic components
11 Base material
12 Lower layer
13 Intermediate layer
14 Upper layer
15 Outermost Layer

The invention claimed is:

1. A metallic material for electronic components, having low degree of whisker formation, low adhesive wear property and high durability, the material comprising:
  a base material;
  a lower layer formed on the base material, the lower layer consisting of one or two or more selected from a constituent element group A consisting of Ni, Cr, Mn, Fe, Co and Cu;
  an intermediate layer formed on the lower layer, the intermediate layer consisting of one or two or more selected from a constituent element group B consisting of Ag, Au, Pt, Rh, Os and Ir;
  an upper layer formed on the intermediate layer, the upper layer consisting of an alloy consisting of one or two or more selected from the constituent element group B and one or two selected from a constituent element group C consisting of Sn and In; and
  an outermost layer formed on the upper layer, the outermost layer consisting of one metal, which metal is selected from the constituent element group C,
  wherein the thickness of the lower layer is 0.05 µm or more and less than 5.00 µm; the thickness of the intermediate layer is 0.01 µm or more and less than 0.50 µm; the thickness of the upper layer is less than 0.50 µm; and the thickness of the outermost layer is 0.005 µm or more and less than 0.30 µm.

2. The metallic material for electronic components according to claim 1, wherein the maximum value (µm) of the elevation differences between adjacent hills and valleys in a profile of an interface between the outermost layer and the upper layer is 50% or less of the thickness (µm) of the outermost layer.

3. The metallic material for electronic components according to claim 1, wherein the upper layer comprises the metal(s) of the constituent element group C in a content of 10 to 50 at %.

4. The metallic material for electronic components according to claim 1, wherein a ζ (zeta)-phase being a Sn—Ag alloy and/or an ε (epsilon)-phase being a Sn—Ag alloy is present.

5. The metallic material for electronic components according to claim 1, wherein a β-Sn being a Sn single phase is further present.

6. The metallic material for electronic components according to claim 1, wherein the thickness ratio between the outermost layer and the upper layer is such that outermost layer:upper layer=1:9 to 6:4.

7. The metallic material for electronic components according to claim 1, wherein the indentation hardness of the surface of the outermost layer, the hardness being obtained by hitting a dent on the surface of the outermost layer with a load of 10 mN on the basis of a nanoindentation hardness test, is 1000 MPa or more.

8. The metallic material for electronic components according to claim 1, wherein the indentation hardness measured from the surface of the outermost layer, the hardness being obtained by hitting a dent on the surface of the outermost layer with a load of 10 mN on the basis of a nanoindentation hardness test, is 10000 MPa or less.

9. A metallic material for electronic components, having low degree of whisker formation, low adhesive wear property and high durability, the material comprising:
  a base material;
  a lower layer formed on the base material, the lower layer consisting of an alloy comprising one or two or more selected from a constituent element group A consisting of Ni, Cr, Mn, Fe, Co and Cu;
an intermediate layer formed on the lower layer, the intermediate layer consisting of one or two or more selected from a constituent element group B consisting of Ag, Au, Pt, Rh, Os and Ir;
an upper layer formed on the intermediate layer, the upper layer consisting of an alloy consisting of one or two or more selected from the constituent element group B and one or two selected from a constituent element group C consisting of Sn and In; and
an outermost layer formed on the upper layer, the outermost layer consisting of one metal, which metal is selected from the constituent element group C,
wherein the thickness of the lower layer is 0.05 µm or more and less than 5.00 µm; the thickness of the intermediate layer is 0.01 µm or more and less than 0.50 µm; the thickness of the upper layer is less than 0.50 µm; and the thickness of the outermost layer is 0.005 µm or more and less than 0.30 µm, and
wherein in the lower layer the content of the metal(s) of the constituent element group A is 50% by mass or more in terms of the total content of Ni, Cr, Mn, Fe, Co and Cu, and the rest of the alloy consists of one or two or more selected from a group consisting of B, P, Sn and Zn.

10. A metallic material for electronic components, having low degree of whisker formation, low adhesive wear property and high durability, the material comprising:
a base material;
a lower layer formed on the base material, the lower layer consisting of one or two or more selected from a constituent element group A consisting of Ni, Cr, Mn, Fe, Co and Cu;
an intermediate layer formed on the lower layer, the intermediate layer consisting of an alloy comprising one or two or more selected from a constituent element group B consisting of Ag, Au, Pt, Rh, Os and Ir;
an upper layer formed on the intermediate layer, the upper layer consisting of an alloy composed of one or two or more selected from the constituent element group B and one or two selected from a constituent element group C consisting of Sn and In; and
an outermost layer formed on the upper layer, the outermost layer consisting of one metal, which metal is selected from the constituent element group C,
wherein the thickness of the lower layer is 0.05 µm or more and less than 5.00 µm; the thickness of the intermediate layer is 0.01 µm or more and less than 0.50 µm; the thickness of the upper layer is less than 0.50 µm; and the thickness of the outermost layer is 0.005 µm or more and less than 0.30 µm, and
wherein in the intermediate layer the content of the metal(s) of the constituent element group B is 50% by mass or more in terms of the total content of Ag, Au, Pt, Rh, Os and Ir, and the rest of the alloy component consists of one or two or more selected from the group consisting of Bi, Cd, Co, Cu, Fe, In, Mn, Mo, Ni, Pb, Sb, Se, Sn, W, Tl and Zn.

11. A metallic material for electronic components, having low degree of whisker formation, low adhesive wear property and high durability, the material comprising:
a base material;
a lower layer formed on the base material, the lower layer consisting of one or two or more selected from a constituent element group A consisting of Ni, Cr, Mn, Fe, Co and Cu;
an intermediate layer formed on the lower layer, the intermediate layer consisting of one or two or more selected from a constituent element group B consisting of Ag, Au, Pt, Rh, Os and Ir;
an upper layer formed on the intermediate layer, the upper layer consisting of an alloy comprising one or two or more selected from the constituent element group B and one or two selected from a constituent element group C consisting of Sn and In; and
an outermost layer formed on the upper layer, the outermost layer consisting of one metal, which metal is selected from the constituent element group C,
wherein the thickness of the lower layer is 0.05 µm or more and less than 5.00 µm; the thickness of the intermediate layer is 0.01 µm or more and less than 0.50 µm; the thickness of the upper layer is less than 0.50 µm; and the thickness of the outermost layer is 0.005 µm or more and less than 0.30 µm, and
wherein in the upper layer the content of the metal(s) of the constituent element group C is 50% by mass or more in terms of the total content of Sn and In, and the rest of the alloy component consists of one or two or more selected from the group consisting of Ag, As, Au, Bi, Cd, Co, Cr, Cu, Fe, Mn, Mo, Ni, Pb, Sb, W and Zn.

12. The metallic material for electronic components according to claim 1, wherein P is deposited on the surface of the outermost layer, and the deposition amount of P is $1 \times 10^{-11}$ to $4 \times 10^{-8}$ mol/cm$^2$.

13. The metallic material for electronic components according to claim 12, wherein N is further deposited on the surface of the outermost layer, and the deposition amount of N is $2 \times 10^{-12}$ to $8 \times 10^{-9}$ mol/cm$^2$.

14. The metallic material for electronic components according to claim 13, wherein in the XPS analysis performed for the outermost layer, with I(P2s) denoting the photoelectron detection intensity due to a 2S orbital electron of P to be detected and I(N1s) denoting the photoelectron detection intensity due to a 1S orbital electron of N to be detected, a relation $0.1 \leq I(P2s)/I(N1s) \leq 1$ is satisfied.

15. The metallic material for electronic components according to claim 13, wherein in an XPS analysis performed for the outermost layer, with I(P2s) denoting a photoelectron detection intensity due to a 2S orbital electron of P to be detected and I(N1s) denoting a photoelectron detection intensity due to a 1S orbital electron of N to be detected, a relation $1 \leq I(P2s)/I(N1s) \leq 50$ is satisfied.

16. A method for producing the metallic material for electronic components according to claim 12, the metallic material comprising:
a base material;
a lower layer formed on the base material, the lower layer consisting of one or two or more selected from a constituent element group A consisting of Ni, Cr, Mn, Fe, Co and Cu;
an intermediate layer formed on the lower layer, the intermediate layer consisting of one or two or more selected from a constituent element group B consisting of Ag, Au, Pt, Rh, Os and Ir;
an upper layer formed on the intermediate layer, the upper layer consisting of an alloy composed of one or two or more selected from the constituent element group B and one or two selected from a constituent element group C consisting of Sn and In; and
an outermost layer formed on the upper layer, the outermost layer consisting of one metal, which metal is selected from the constituent element group C, wherein the surface of the metallic material is surface-treated with a phosphoric acid ester-based solution including at least one of the phosphoric acid esters represented by the following formulas 1 and 2, and at least one selected from the group of the cyclic organic compounds represented by the following formulas 3a, 3b, 3c, 3d, 3e, 3f, 3g, 3h, 3i and 3j, and the formulas 4a, 4b, and 4c:

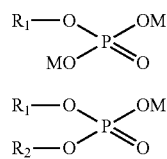

(1)

(2)

wherein, in formulas 1 and 2, $R_1$ and $R_2$ each represent a substituted alkyl group and M represents a hydrogen atom or an alkali metal atom;

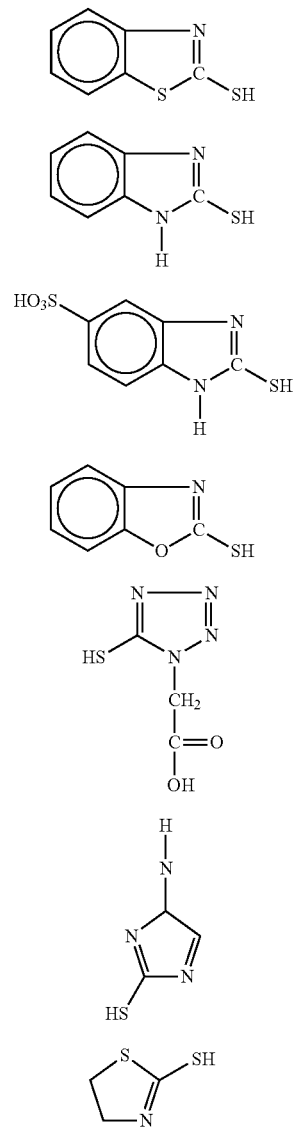

[3a]

[3b]

[3c]

[3d]

[3e]

[3f]

[3g]

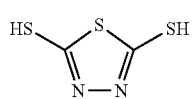

[3h]

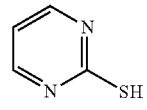

[3i]

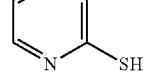

[3j]

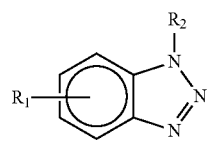

[4a]

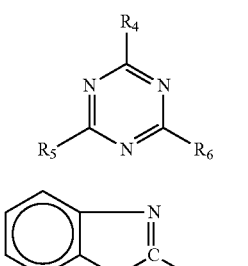

[4b]

[4c]

wherein, in formula 4a, $R_1$ represents a hydrogen atom, an alkyl group or a substituted alkyl group; $R_2$ represents an alkali metal atom, a hydrogen atom, an alkyl group or a substituted alkyl group; in formula 4c, $R_3$ represents an alkali metal atom or a hydrogen atom; in formula 4b, $R_4$ represents —SH, an alkyl group-substituted or aryl group-substituted amino group, or represents an alkyl-substituted imidazolylalkyl group; and $R_5$ and $R_6$ each represent —NH$_2$, —SH or —SM, wherein M represents an alkali metal atom.

17. The method for producing a metallic material for electronic components according to claim 16, wherein the surface treatment with the phosphoric acid ester-based solution is performed by applying the phosphoric acid ester-based solution to the outermost layer.

18. The method for producing a metallic material for electronic components according to claim 16, wherein the surface treatment with the phosphoric acid ester-based solution is performed by conducting an electrolysis by immersing the metallic material after the formation of the outermost layer in the phosphoric acid ester-based solution and using as the anode the metallic material after the formation of the outermost layer.

19. An FFC terminal including a contact portion, using, in the contact portion thereof, the metallic material for electronic components according to claim 1.

20. An FPC terminal including a contact portion, using, in the contact portion thereof, the metallic material for electronic components according to claim 1.

21. An electronic component including an electrode, using, in the electrode thereof for external connection, the metallic material for electronic components according to claim 1.

22. An electronic component using the metallic material for electronic components according to claim 1, in a push-in type terminal thereof for fixing a board connection portion to a board by pushing the board connection portion into a through hole formed in the board, wherein a female terminal connection portion and the board connection portion are provided respectively on one side and the other side of a mounting portion to be attached to a housing.

* * * * *